(12) United States Patent
Nezuka et al.

(10) Patent No.: US 11,846,656 B2
(45) Date of Patent: Dec. 19, 2023

(54) CURRENT SENSOR

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Tomohiro Nezuka, Nisshin (JP); Yoshikazu Furuta, Nisshin (JP); Shotaro Wada, Nisshin (JP)

(73) Assignees: DENSO CORPORATION, Kariya (JP); TOYOTA IDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 7 days.

(21) Appl. No.: 17/834,061

(22) Filed: Jun. 7, 2022

(65) Prior Publication Data
US 2023/0059928 A1    Feb. 23, 2023

(30) Foreign Application Priority Data

Aug. 17, 2021   (JP) ................................ 2021-132749

(51) Int. Cl.
 *G01R 15/14*    (2006.01)
 *G01R 19/252*   (2006.01)

(52) U.S. Cl.
 CPC ......... *G01R 15/146* (2013.01); *G01R 19/252* (2013.01)

(58) Field of Classification Search
 CPC .. G01R 15/146; G01R 19/252; G01R 35/005; G01R 1/203
 USPC ............................ 324/253, 72, 76.11, 83, 96
 See application file for complete search history.

(56) References Cited

U.S. PATENT DOCUMENTS

| | | | | |
|---|---|---|---|---|
| 6,909,275 B2* | 6/2005 | Hartzsch | ............... | G01R 17/105 324/537 |
| 8,779,777 B2* | 7/2014 | Irmer | ................. | G01R 19/0092 324/130 |
| 8,947,101 B2* | 2/2015 | Engl | ....................... | G01R 27/14 324/202 |
| 9,632,163 B2* | 4/2017 | Mueller | ................. | G01R 1/203 |
| 10,473,724 B2* | 11/2019 | Aumer | ................. | G01R 15/146 |

(Continued)

FOREIGN PATENT DOCUMENTS

| | | |
|---|---|---|
| DE | 10310503 A1 | 9/2004 |
| JP | S62-168049 A | 7/1987 |

*Primary Examiner* — Tung X Nguyen
*Assistant Examiner* — Robert P Alejnikov, Jr.
(74) *Attorney, Agent, or Firm* — POSZ LAW GROUP, PLC

(57) ABSTRACT

A current sensor for detecting a current based on a terminal voltage and a resistance value of a shunt resistor, includes: a resistance value correction circuit having: correction resistors; a signal application unit; a voltage detection unit that detects terminal voltages of the shunt resistor and a part of the correction resistors in a first period, and terminal voltages of all of the correction resistors in a second period; and a correction unit that corrects the resistance value for current detection based on a calculated resistance value of the shunt resistor. Resistance values and resistance accuracies of the correction resistors are higher as the plurality of correction resistors are disposed farther from the shunt resistor.

7 Claims, 17 Drawing Sheets

(56) References Cited

U.S. PATENT DOCUMENTS

2017/0089955 A1* 3/2017 Yugou ................... B60L 3/0038
2020/0182936 A1* 6/2020 Min ..................... G01R 31/364

* cited by examiner

CURRENT SENSOR

CROSS REFERENCE TO RELATED APPLICATION

The present application claims the benefit of priority from Japanese Patent Application No. 2021-132749 filed on Aug. 17, 2021. The entire disclosure of the above application is incorporated herein by reference.

TECHNICAL FIELD

The present disclosure relates to a current sensor that detects a detection target current by using a terminal voltage of a shunt resistor provided in series in a path through which the detection target current flows and a resistance value for current detection corresponding to the resistance value of the shunt resistor.

BACKGROUND

According to first and second conceivable techniques, in the conceivable current sensor, the terminal voltage of the shunt resistor provided in series with the path through which the detection target current flows is measured, and the current as the detection target is calculated based on the measured voltage and the resistance value for current detection corresponding to the resistance value of the shunt resistor. In this case, since the resistance value of the shunt resistor may change due to deterioration over time or the like, it may be necessary to correct the resistance value for current detection used for calculating the current at any time. In the following description, the conceivable current sensor disclosed in the first conceivable technique will be referred to as a first conceivable technique, and the conceivable current sensor disclosed in the second conceivable technique will be referred to as a second conceivable technique.

In the first conceivable technique, the resistance value for current detection is corrected as follows. That is, the first conceivable technique provides a sub-resistor provided so that a detection target current flows in the sub-resistor, similar to the shunt resistor in a normal state, and a correction resistor provided so that a detection target current does not flow in the correction resistor in a normal time. According to the above configuration, the sub-resistor deteriorates with time similar to the shunt resistor, but the correction resistor hardly deteriorates with time. In the first conceivable technique, the degree of deterioration of the sub-resistor and the shunt resistor is obtained by comparing the resistance value of the sub-resistor and the correction resistor at the time of correction, and the resistance value for current detection is corrected based on the deterioration degree.

In the second conceivable technique, the resistance value for current detection is corrected as follows. That is, the second conceivable technique has a configuration in which a plurality of shunt resistors are provided and a correction current is passed from the interconnection nodes of the plurality of shunt resistors, or an input terminal is provided in the central portion of the shunt resistor and a correction current is passed from the input terminal. In the second conceivable technique, the terminal voltage of each resistor when a correction current is passed is measured, and the individual resistance value is calculated based on the measurement result to correct the resistance value for current detection.

SUMMARY

According to an example, a current sensor for detecting a current based on a terminal voltage and a resistance value of a shunt resistor, includes: a resistance value correction circuit having: correction resistors; a signal application unit; a voltage detection unit that detects terminal voltages of the shunt resistor and a part of the correction resistors in a first period, and terminal voltages of all of the correction resistors in a second period; and a correction unit that corrects the resistance value for current detection based on a calculated resistance value of the shunt resistor. Resistance values and resistance accuracies of the correction resistors are higher as the plurality of correction resistors are disposed farther from the shunt resistor.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
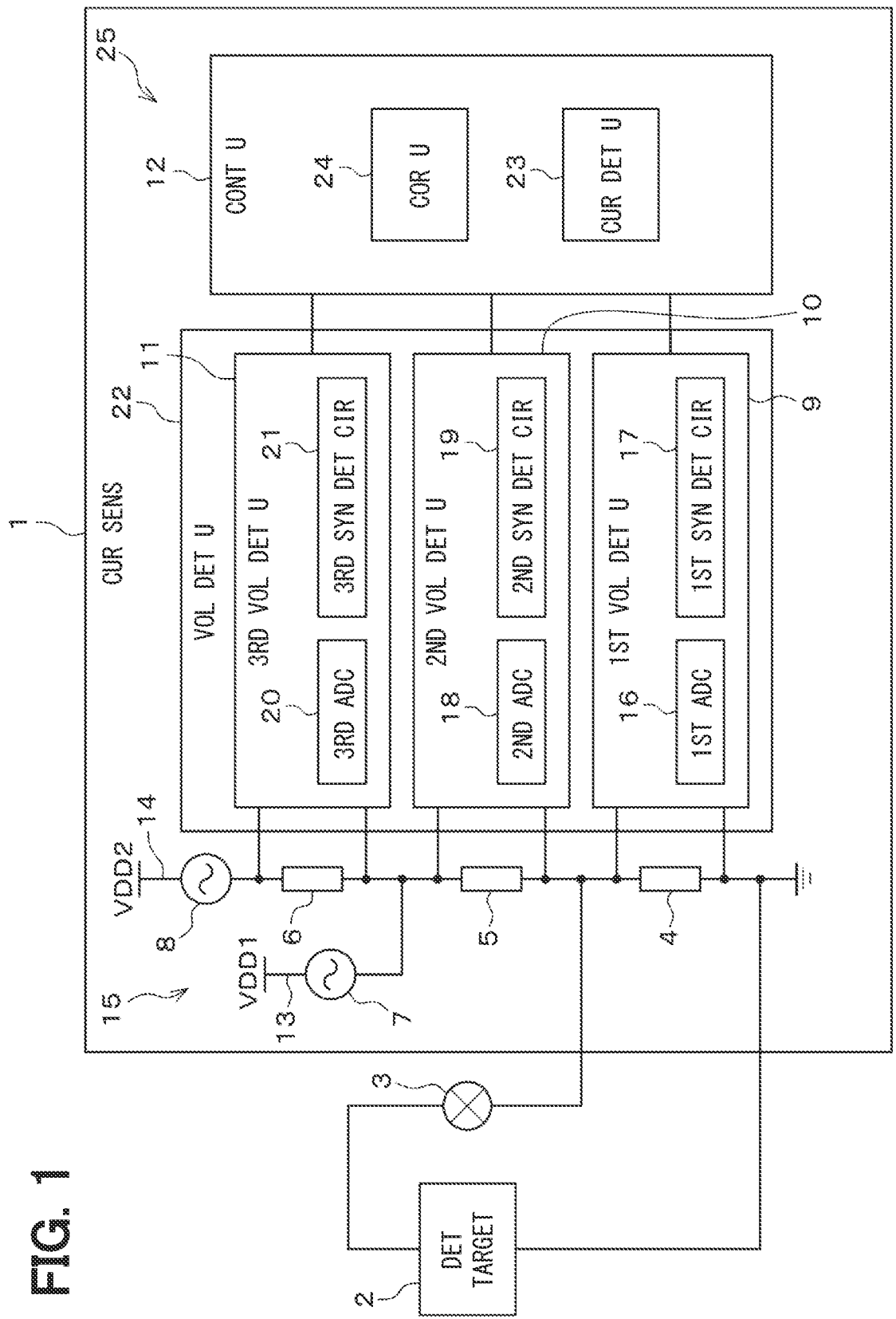
FIG. 1 is a diagram schematically showing a configuration of a current sensor according to a first embodiment.

In the first conceivable technique, the shunt resistor is not used for direct correction, and it is assumed that the sub-resistor deteriorates in the same manner as the shunt resistor, and then the sub-resistor is used to indirectly correct the resistance value for the current detection corresponding to the resistance value of the shunt resistor. Therefore, in the first conceivable technique, if the above assumption is not satisfied, the resistance value for current detection may not be corrected with high accuracy, and as a result, the current detection accuracy may decrease.

In the second conceivable technique, since it is necessary to provide a plurality of shunt resistors or to provide an input terminal in the central portion of the shunt resistor, there arises a difficulty that the configuration becomes complicated. Further, in the second conceivable technique, it is difficult to sufficiently improve the accuracy of the correction because the accuracy of the correction of the resistance value for current detection greatly depends on the accuracy of the correction current.

The present embodiments have been made in view of the above circumstances, and the present embodiments provide a current sensor capable of accurately correcting a resistance value for current detection without incurring a complicated configuration.

A current sensor detects a detection target current based on a terminal voltage of a shunt resistor provided in series in a path through which the detection target current flows and a resistance value for current detection corresponding to a resistance value of the shunt resistor. The current sensor includes a resistance value correction circuit for correcting the resistance value for current detection. The resistance value correction circuit includes a plurality of correction resistors, a signal application unit, a voltage detection unit, and a correction unit. The plurality of correction resistors are all connected in series together with the shunt resistor in a path different from the path through which the detection target current flows, and the resistance accuracy thereof is higher than that of the shunt resistor.

The signal application unit applies an alternating current signal to all or a part of the series circuit of the shunt resistor and the plurality of correction resistors. The voltage detection unit detects the terminal voltage of the shunt resistor and the terminal voltage of a part of the correction resistors in the first period when the AC signal is applied to a part of the series circuit including the shunt resistor. Further, the voltage detection unit detects the terminal voltage of all the correction resistors in the second period in which the AC signal is applied to all of the series circuit. The correction unit calculates the resistance value of the shunt resistor based on the detection value of the terminal voltage by the voltage detection unit in the first period and the detection value of the terminal voltage by the voltage detection unit in the second period, and also corrects the resistance value for the detection based on the calculated resistance value as the calculated resistance of the shunt resistor.

According to such a configuration, it is possible to directly correct the resistance value for detection by using the shunt resistor without indirectly correcting the resistance value for detection by using the sub-resistors as in the first conceivable technique. Further, according to the above configuration, unlike the second conceivable technique, it is not necessary to provide a plurality of shunt resistors nor to provide an input terminal at the center of the shunt resistors, and only one shunt resistor needs to be provided, so that the configuration of the entire current sensor is not complicated.

Further, according to the above configuration, the calculation accuracy of the calculated resistance value and the correction accuracy of the resistance value for detection depend greatly on the accuracy of the resistance value of the correction resistor disposed far from the shunt resistor in the series circuit and the detection accuracy of the terminal voltage by the voltage detection unit. In this case, the resistance value and the resistance value accuracy of the plurality of correction resistors are higher as they are farther from the shunt resistor in the series circuit. In general, it may be difficult to accurately form a resistor having a small resistance value, but it may be relatively easy to accurately form a resistor having a large resistance value.

Therefore, according to the above configuration, it is possible to sufficiently improve the accuracy of the resistance value of the correction resistor far from the shunt resistor, which is greatly related to the accuracy of the correction of the resistance value for detection, and as a result, the accuracy of correction of the resistance value for detection is sufficiently improved. Therefore, according to the above configuration, it is possible to obtain an excellent effect that the resistance value for detection can be corrected with high accuracy without complicating the configuration of the entire current sensor.

The following will describe embodiments of the present disclosure with reference to the accompanying drawings. In each embodiment, the substantially same components are denoted by the same reference numerals and description thereof will be omitted.

First Embodiment

The following describes a first embodiment with reference to FIGS. 1 to 5.

(General Configuration)

The current sensor 1 of the present embodiment shown in FIG. 1 is mounted on a vehicle such as an automobile, and detects a detection target current which is a current flowing through the measurement target 2. The measurement target 2 may be a battery such as a main engine battery that supplies electric power to a drive unit for traveling a vehicle, an auxiliary battery that supplies electric power to an auxiliary device of the vehicle, a DC/DC converter, and the like. The DC/DC converter supplies electric power to a motor that generates a driving force for driving a vehicle, and constitutes the above-mentioned driving unit together with the motor.

In this case, the load 3 is connected in series to the measurement target 2, and the loop circuit is configured by the measurement target 2, the load 3, a switch (not shown), and the like. When the measurement target 2 is the above-mentioned battery, the load 3 may be, for example, the above-mentioned motor, the above-mentioned DC/DC converter, the electric compressor, or the like. Further, when the measurement target 2 is the above-mentioned DC/DC converter, the load 3 may be, for example, the above-mentioned motor or the like.

The current sensor 1 includes a shunt resistor 4, correction resistors 5, 6, a first signal application unit 7, a second signal application unit 8, a first voltage detection unit 9, a second voltage detection unit 10, a third voltage detection unit 11, and a control unit 12. One terminal of the shunt resistor 4 is connected to the high potential side terminal of the measurement target 2 via the load 3, and the other terminal is connected to the ground which is the reference potential of the circuit and the low potential side terminal of the measurement target 2. That is, the shunt resistor 4 is provided in series with the path through which the detection target current flows. The current sensor 1 detects the detection target current using the terminal voltage of the shunt resistor 4 provided in this way and the resistance value for detection corresponding to the resistance value of the shunt resistor 4.

One terminal of the correction resistor 5 is connected to the first signal application unit 7, and the other terminal is connected to the one terminal of the shunt resistor 4. One terminal of the correction resistor 6 is connected to the second signal application unit 8, and the other terminal is connected to the one terminal of the correction resistor 5. That is, the correction resistors 5 and 6 are all connected in series together with the shunt resistor 4 in a path different from the path through which the detection target current flows. In this case, since the detection target current is a relatively large current, the resistance value of the shunt resistor 4 is a relatively small value, for example, on the order of μΩ.

On the other hand, since a relatively large detection target current does not flow through the correction resistors 5 and 6, their resistance values are relatively large, for example, on the order of mΩ. In general, it may be difficult to accurately form a resistor having a small resistance value, but it may be relatively easy to accurately form a resistor having a large resistance value. Therefore, in the present embodiment, the resistance accuracy of the correction resistors 5 and 6 is sufficiently higher than the resistance accuracy of the shunt resistor 4. As described above, the current sensor 1 of the present embodiment includes a plurality of correction resistors, specifically, two correction resistors, all of which are connected in series together with the shunt resistor 4 in a path different from a path where the detection target current flows, and the resistance accuracy of each correction resistor is higher than the shunt resistor 4.

The first signal application unit 7 applies a pulsed or sine wave AC signal to a part of the series circuit of the shunt resistor 4 and the correction resistors 5 and 6, specifically, the series circuit of the shunt resistor 4 and the correction resistor 5 at the time of correction when the resistance value for detection described later is corrected. In other words, the first signal application unit 7 applies the same AC signal to the shunt resistor 4 and the correction resistor 5 at the time of correction. In this case, the first signal application unit 7 is configured as a current source for supplying an alternating current from the power supply line 13, to which the power supply voltage VDD1 is supplied, to the series circuit of the shunt resistor 4 and the correction resistor 5.

At the time of correction, the second signal application unit 8 applies a pulse wave or sine wave AC signal to all of the series circuits of the shunt resistor 4 and the correction resistors 5 and 6. In other words, the second signal application unit 8 applies the same AC signal to the shunt resistor 4 and the correction resistors 5 and 6 at the time of correction. In this case, the second signal application unit 8 is configured as a current source to supply an alternating current from the power supply line 14 to which the power supply voltage VDD2, which is a voltage higher than the power supply voltage VDD1, to the series circuit of the shunt resistor 4 and the correction resistors 5 and 6. In the present embodiment, the power supply voltage VDD1 is set to a voltage of, for example, about +1V, and the power supply voltage VDD2 is set to a voltage of, for example, about +5V.

As described above, in the present embodiment, the first signal application unit 7 and the second signal application unit 8 apply an AC signal to all or a part of the series circuit of the shunt resistor 4 and the plurality of correction resistors 5 and 6, and function as a signal application unit 15. In the following, the period in which the AC signal is applied to the series circuit of the shunt resistor 4 and the correction resistor 5 by the first signal application unit 7 is referred to as the first period, and the period in which the AC signal is applied to the shunt resistor 4 and the correction resistors 5 and 6 by the second signal application unit 8 is referred to as a second period.

The first voltage detection unit 9 detects the terminal voltage of the shunt resistor 4 in the first period at the time of correction, and includes a first A/D converter 16 and a first synchronous detection circuit 17. In drawings such as FIG. 1, the A/D converter is abbreviated as ADC. The first A/D converter 16 performs the following A/D conversion operation in order to detect the terminal voltage of the shunt resistor 4. That is, the first A/D converter 16 inputs the signal of each terminal of the shunt resistor 4, and by performing A/D conversion of each signal, outputs the difference in the voltage of each terminal of the shunt resistor 4, that is, the digital signal corresponding to the inter-terminal voltage of the shunt resistor 4. The digital signal output from the first A/D converter 16 in this way is a signal corresponding to the signal of the terminal of the shunt resistor 4.

The first synchronous detection circuit 17 inputs a digital signal output from the first A/D converter 16, and synchronously detects the signal at the same frequency as the AC signal in the first signal application unit 7, and extracts the signal. Then, the first synchronous detection circuit 17 outputs the extracted signal to the control unit 12. The output signal of the first synchronous detection circuit 17 is a signal corresponding to the terminal voltage of the shunt resistor 4. In this way, during the first period of correction, the first voltage detection unit 9 is configured to detect the terminal voltage of the shunt resistor 4 based on the output signal of the first synchronous detection circuit 17, and outputs the signal representing the detection value of the terminal voltage to the control unit 12.

The first voltage detection unit 9 detects the terminal voltage of the shunt resistor 4 as follows when the resistance value for detection described later is not corrected, that is, in the normal state. That is, in the normal state, the first A/D converter 16 performs the A/D conversion operation in the same manner as in the correction time. In this case, the digital signal output from the first A/D converter 16 is output to the control unit 12 without being input to the first synchronous detection circuit 17. That is, in the normal state, the first voltage detection unit 9 detects the terminal voltage of the shunt resistor 4 based on the output signal of the first A/D converter 16, and outputs a signal representing the detection value of the terminal voltage to the control unit 12.

The second voltage detection unit 10 detects the terminal voltage of the shunt resistor 5 in the first period and the second period at the time of correction, and includes a second A/D converter 18 and a second synchronous detection circuit 19. The second A/D converter 18 performs an A/D conversion operation as follows in order to detect the terminal voltage of the correction resistor 5. That is, the second A/D converter 18 inputs the signal of each terminal of the correction resistor 5, and by performing A/D conversion of each signal, outputs the difference in the voltage of each terminal of the correction resistor 5, that is, a digital signal corresponding to the inter-terminal voltage of the correction resistor 5. The digital signal output from the second A/D converter 18 in this way is a signal corresponding to the signal of the terminal of the correction resistor 5.

The second synchronous detection circuit 19 inputs a digital signal output from the second A/D converter 18, performs synchronous detection to extract a signal, and outputs the extracted signal to the control unit 12. In this case, the second synchronous detection circuit 19 performs synchronous detection at the same frequency as the frequency of the AC signal in the first signal application unit 7 in the first period, and performs synchronous detection in the same frequency as the frequency of the AC signal in the second signal application unit 8 in the second period. The output signal of the second synchronous detection circuit 19 is a signal corresponding to the terminal voltage of the correction resistor 5. In this way, during the first period and the second period of correction, the second voltage detection unit 10 is configured to detect the terminal voltage of the correction resistor 5 based on the output signal of the second synchronous detection circuit 19, and outputs the signal representing the detection value of the terminal voltage to the control unit 12.

The third voltage detection unit 11 detects the terminal voltage of the correction resistor 6 in the second period at the time of correction, and includes a third A/D converter 20 and a third synchronous detection circuit 21. The third A/D converter 20 performs an A/D conversion operation as follows in order to detect the terminal voltage of the correction resistor 6. That is, the third A/D converter 20 inputs the signal of each terminal of the correction resistor 6, and by performing A/D conversion of each signal, outputs the difference in the voltage of each terminal of the correction resistor 6, that is, a digital signal corresponding to the inter-terminal voltage of the correction resistor 6. The digital signal output from the third A/D converter 20 in this way is a signal corresponding to the signal of the terminal of the correction resistor 6.

The third synchronous detection circuit 21 inputs a digital signal output from the third A/D converter 20 and synchronously detects the signal at the same frequency as the AC signal in the second signal application unit 8, and extracts the signal. Then, the third synchronous detection circuit 21 outputs the extracted signal to the control unit 12. The output signal of the third synchronous detection circuit 21 is a signal corresponding to the terminal voltage of the correction resistor 6. In this way, during the second period of correction, the third voltage detection unit 11 is configured to detect the terminal voltage of the correction resistor 6 based on the output signal of the third synchronous detection circuit 21, and outputs the signal representing the detection value of the terminal voltage to the control unit 12.

As described above, in the present embodiment, the first voltage detection unit 9, the second voltage detection unit 10, and the third voltage detection unit 11 detect the terminal voltage of the shunt resistor 4 and the terminal voltage of a part of the correction resistor 5 in the first period in which the AC signal is applied to the series circuit of the shunt resistor 4 and the correction resistor 5, and detect the terminal voltages of all the correction resistors 5 and 6 in the second period in which the AC signal is applied to the shunt resistor 4 and the correction resistors 5 and 6. Thus, the first voltage detection unit 9, the second voltage detection unit 10, and the third voltage detection unit 11 function as the voltage detection unit 22.

In this case, the voltage detection unit 22 includes a plurality of A/D converters capable of performing an A/D conversion operation for detecting the terminal voltages of the shunt resistor 4 and the correction resistors 5 and 6, that is, the first A/D converter 16, a second A/D converter 18, and a third A/D converter 20. Further, in this case, the voltage detection unit 22 is configured to input the signal of the terminal of the shunt resistor 4 and perform synchronous detection to extract the signal, and detect the terminal voltage of the shunt resistor 4 based on the extracted signal. Further, the voltage detection unit 22 is configured to input the signals of the terminals of the correction resistors 5 and 6 and perform synchronous detection to extract and output the signals, and detect the terminal voltages of the correction resistors 5 and 6 based on the extracted signals.

The control unit 12 is configured as a semiconductor integrated circuit such as the same ASIC together with the voltage detection unit 22. ASIC is an abbreviation for Application Specific Integrated Circuit. The control unit 12 includes functional blocks such as a current detection unit 23 and a correction unit 24. Each of these functional blocks is realized by hardware. The control unit 12 may be configured as a semiconductor integrated circuit separated from the voltage detection unit 22. For example, the control unit 12 may be configured by a microcomputer including a CPU, a RAM, a ROM, and the like. In this case, each of the above-mentioned functional blocks is realized by the CPU of the control unit 12 executing a computer program stored in a ROM or the like to provide a process corresponding to the computer program, that is, realized by software. Alternatively, in this case, at least a part of the functional blocks of the parking lot server device may be implemented in hardware manner.

The current detection unit 23 detect a detection target current using a signal corresponding to the terminal voltage of the shunt resistor 4 output from the first voltage detection unit 9 at the normal time and a resistance value for detection corresponding to the resistance value of the shunt resistor 4. The resistance value for detection is set based on the initial resistance value of the shunt resistor 4 actually used, and is stored in advance in the memory provided in the control unit 12. Here, since the detection target current, which is a relatively large current, flows in the shunt resistor 4, the resistance value changes from the initial value due to deterioration over time or the like.

Therefore, the above-mentioned resistance value for detection is corrected at any time by the operation of the correction unit 24. The correction unit 24 calculates the resistance value of the shunt resistor 4 based on: a signal representing the detection value of the terminal voltage of the shunt resistor 4 output from the voltage detection unit 22 in the first period; a signal representing the detection value of the terminal voltage of the correction resistor 5 output from the voltage detection unit 22 in the first period; a signal representing the detection value of the terminal voltage of the correction resistor 5 output from the voltage detection unit 22 in the second period; a signal representing the detection value of the terminal voltage of the correction resistor 6 output from the voltage detection unit 22 in the second period; a first correction resistance value corresponding to the resistance value of the correction resistor 5; and a second correction resistance value corresponding to the resistance value of the correction resistor 6. The correction unit 24 corrects the resistance value for detection based on the calculated resistance value which is the calculated resistance value of the shunt resistor 4. For example, the correction unit 24 can correct the resistance value for detection so as to match the calculated resistance value.

The first correction resistance value and the second correction resistance value described above are initial resistance values of the correction resistors 5 and 6 actually used, and are stored in advance in the memory provided in the control unit 12. Since the detection target current does not flow in the correction resistors 5 and 6 in the normal state, the resistance value hardly changes from the initial value due to aged deterioration or the like. As described above, in the above configuration, the resistance value correction circuit 25 for correcting the resistance value for detection is configured by the correction resistors 5 and 6, the signal application unit 15, the voltage detection unit 22, and the correction unit 24.

In this case, the resistance value and the resistance accuracy of the plurality of correction resistors 5 and 6 become higher as the distance from the shunt resistor 4 in the series circuit of the shunt resistor 4 and the correction resistors 5 and 6 increases. That is, the resistance value of the correction resistor 6 is higher than the resistance value of the correction resistor 5. Further, the resistance accuracy of the correction resistor 6 is higher than the resistance accuracy of the correction resistor 5.

<Specific Configuration of Signal Application Unit>

Figure 2:
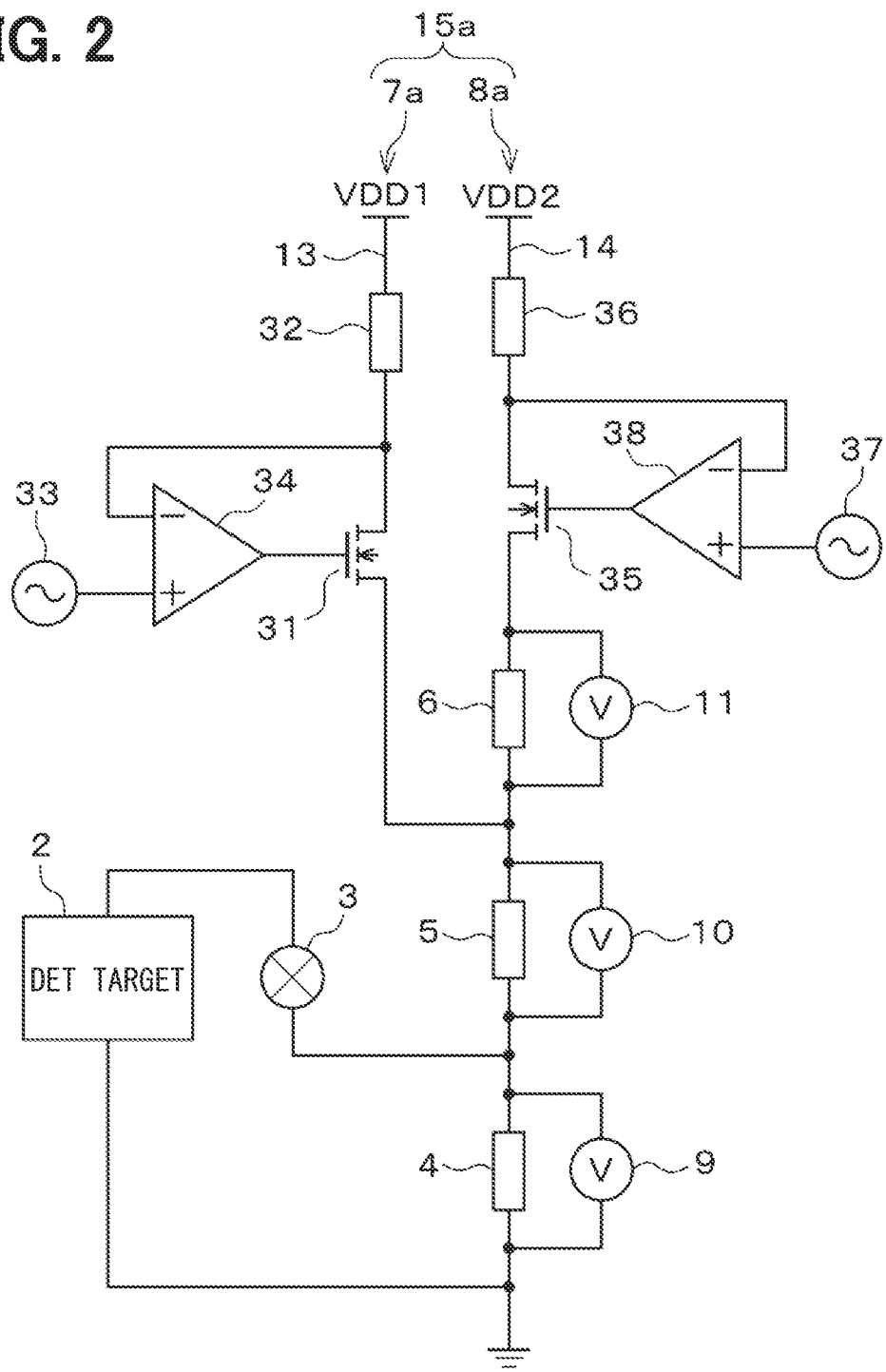
FIG. 2 is a diagram showing a specific first configuration example of the signal application unit according to the first embodiment.
Figure 3:
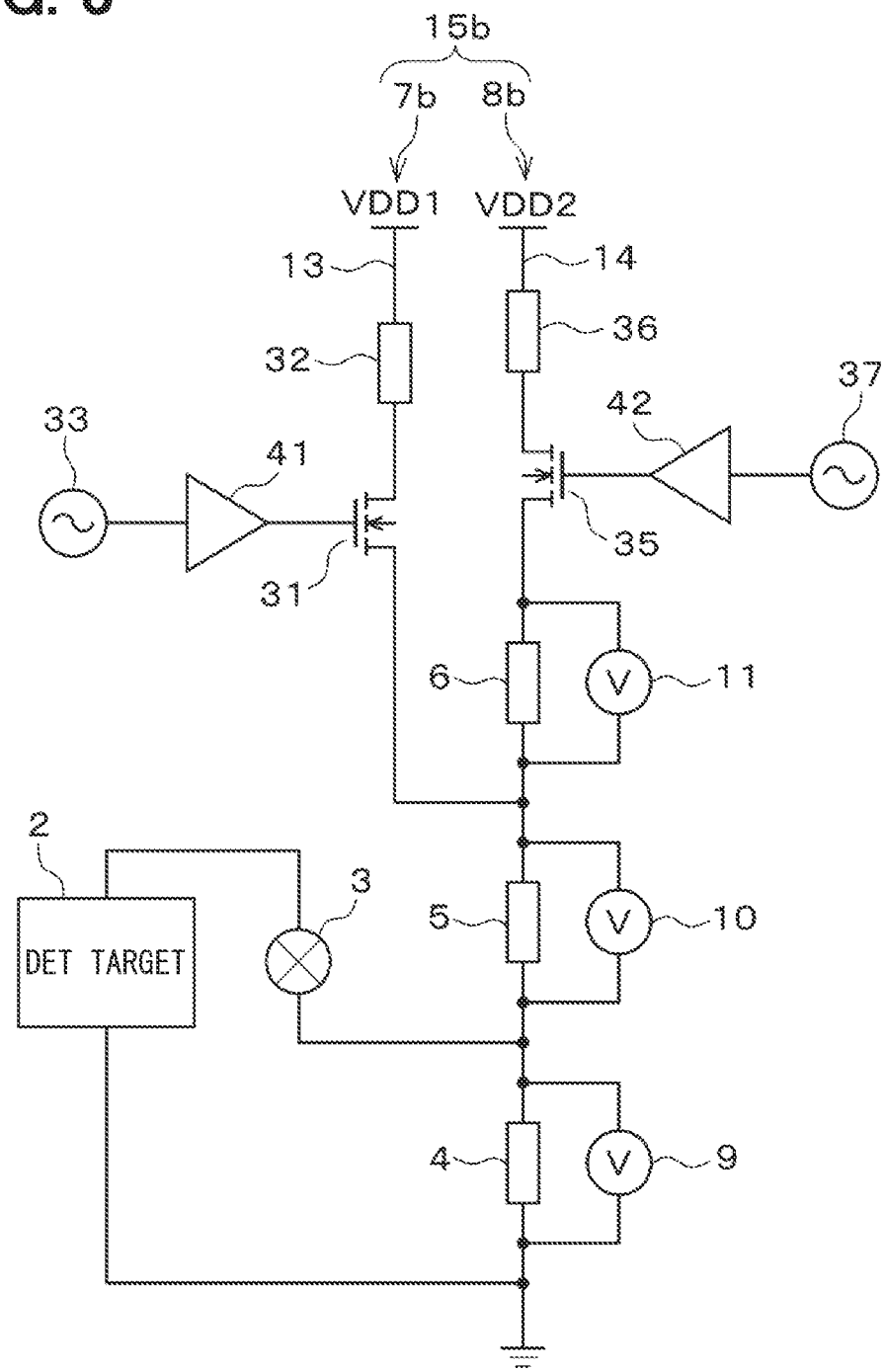
FIG. 3 is a diagram showing a specific second configuration example of the signal application unit according to the first embodiment.

Specific examples of the signal application unit 15 include a first configuration example shown in FIG. 2, a second configuration example shown in FIG. 3, and the like.

[1] First Configuration Example

As shown in FIG. 2, the first signal application unit 7a in the signal application unit 15a of the first configuration example includes a transistor 31, a resistor 32, a signal generation unit 33, an operational amplifier 34, and the like. The transistor 31 is, for example, an N-channel MOSFET whose drain is connected to the power supply line 13 via a resistor 32 and source is connected to ground via a correction resistor 5 and a shunt resistor 4.

The signal generation unit 33 generates and outputs a pulse wave signal or a sine wave signal having the same frequency as the alternating current applied to the series circuit of the shunt resistor 4 and the correction resistor 5. The output signal of the signal generation unit 33 is given to the non-inverting input terminal of the OP amplifier 34. The inverting input terminal of the OP amplifier 34 is connected to the drain of the transistor 31, and its output terminal is connected to the gate of the transistor 31. According to the above configuration, the transistor 31 is driven by the OP amplifier 34, so that an AC signal, which is an alternating current, is applied to the series circuit of the shunt resistor 4 and the correction resistor 5.

Further, the second signal application unit 8a in the signal application unit 15a of the first configuration example includes a transistor 35, a resistor 36, a signal generation unit 37, an operational amplifier 38, and the like. The transistor 35 is, for example, an N-channel MOSFET whose drain is connected to the power supply line 14 via a resistor 36 and source is connected to ground via a correction resistor 5, a correction resistor 6 and a shunt resistor 4. The signal generation unit 37 generates and outputs a pulse wave signal or a sine wave signal having the same frequency as the alternating current applied to the series circuit of the shunt resistor 4 and the correction resistors 5 and 6.

The output signal of the signal generation unit 37 is given to the non-inverting input terminal of the OP amplifier 38. The inverting input terminal of the OP amplifier 38 is connected to the drain of the transistor 35, and its output terminal is connected to the gate of the transistor 35. According to the above configuration, the transistor 35 is driven by the OP amplifier 38, so that an AC signal, which is an alternating current, is applied to the series circuit of the shunt resistor 4 and the correction resistors 5 and 6.

As described above, the first signal application unit 7a and the second signal application unit 8a in the signal application unit 15a of the first configuration example are both configured to be driven by an amplifier. In this case, the transistor 31 and the resistance 32 function as the current source of the first signal application unit 7a, and the transistor 35 and the resistance 36 function as the current source of the second signal application unit 8a.

[2] Second Configuration Example

As shown in FIG. 3, in the first signal application unit 7b in the signal application unit 15b of the second configuration example, the buffer 41 in place of the OP amplifier 34 is arranged with respect to the first signal application unit 7a of the first configuration example shown in FIG. 2, which is different from the first configuration example. In this case, the output signal of the signal generation unit 33 is given to the input terminal of the buffer 41. The output terminal of the buffer 41 is connected to the gate of the transistor 31. According to the above configuration, the transistor 31 is driven by the buffer 41, so that an AC signal, which is an alternating current, is applied to the series circuit of the shunt resistor 4 and the correction resistor 5.

Further, in the second signal application unit 8b in the signal application unit 15b of the second configuration example, the buffer 42 in place of the OP amplifier 38 is arranged with respect to the second signal application unit 8a of the first configuration example shown in FIG. 2, which is different from the first configuration example. In this case, the output signal of the signal generation unit 37 is given to the input terminal of the buffer 42. The output terminal of the buffer 42 is connected to the gate of the transistor 35. According to the above configuration, the transistor 35 is driven by the buffer 42, so that an AC signal, which is an alternating current, is applied to the series circuit of the shunt resistor 4 and the correction resistors 5 and 6. As described above, the first signal application unit 7b and the second signal application unit 8b in the signal application unit 15a of the second configuration example are both buffer-driven.

[3] Features of Each Configuration Example

According to the first configuration example of the amplifier drive configuration, the drain voltages of the transistors 31 and 35 are controlled to be constant by the operation of the OP amplifiers 34 and 38, so that the first configuration example has a merit, compared with the second configuration example of the buffer drive configuration, such that the accuracy of the AC current applied to the series circuit of the shunt resistor 4 and the correction resistors 5 and 6 can be improved. On the other hand, according to the second configuration example, there is an advantage that the circuit scale can be suppressed to be a smaller size by using the buffers 41 and 42 instead of the OP amplifiers 34 and 38 as compared with the first configuration example.

<Specific Configuration of Each Synchronous Detection Circuit>

Figure 4:
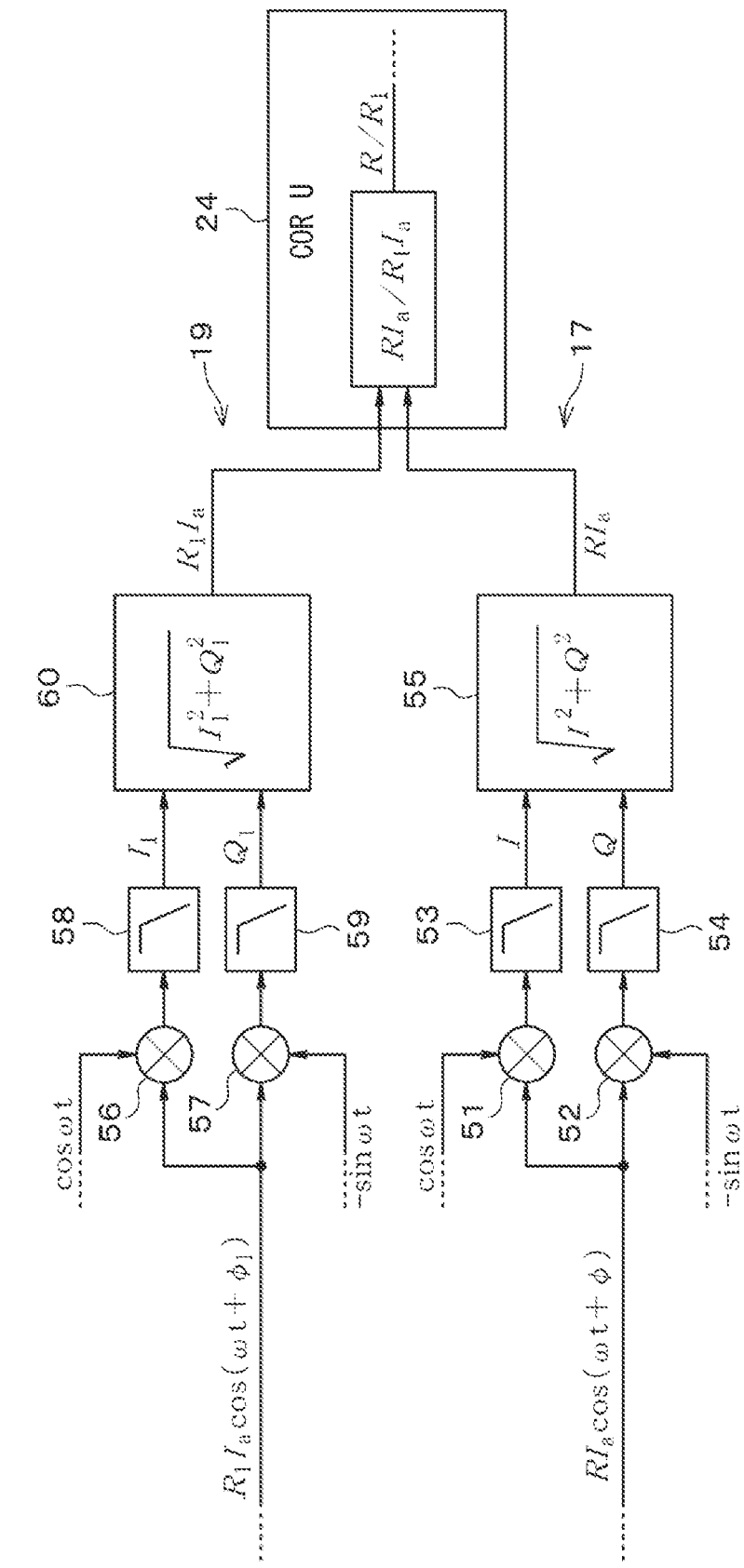
FIG. 4 is a specific first configuration example of each synchronous detection circuit according to the first embodiment.
Figure 5:
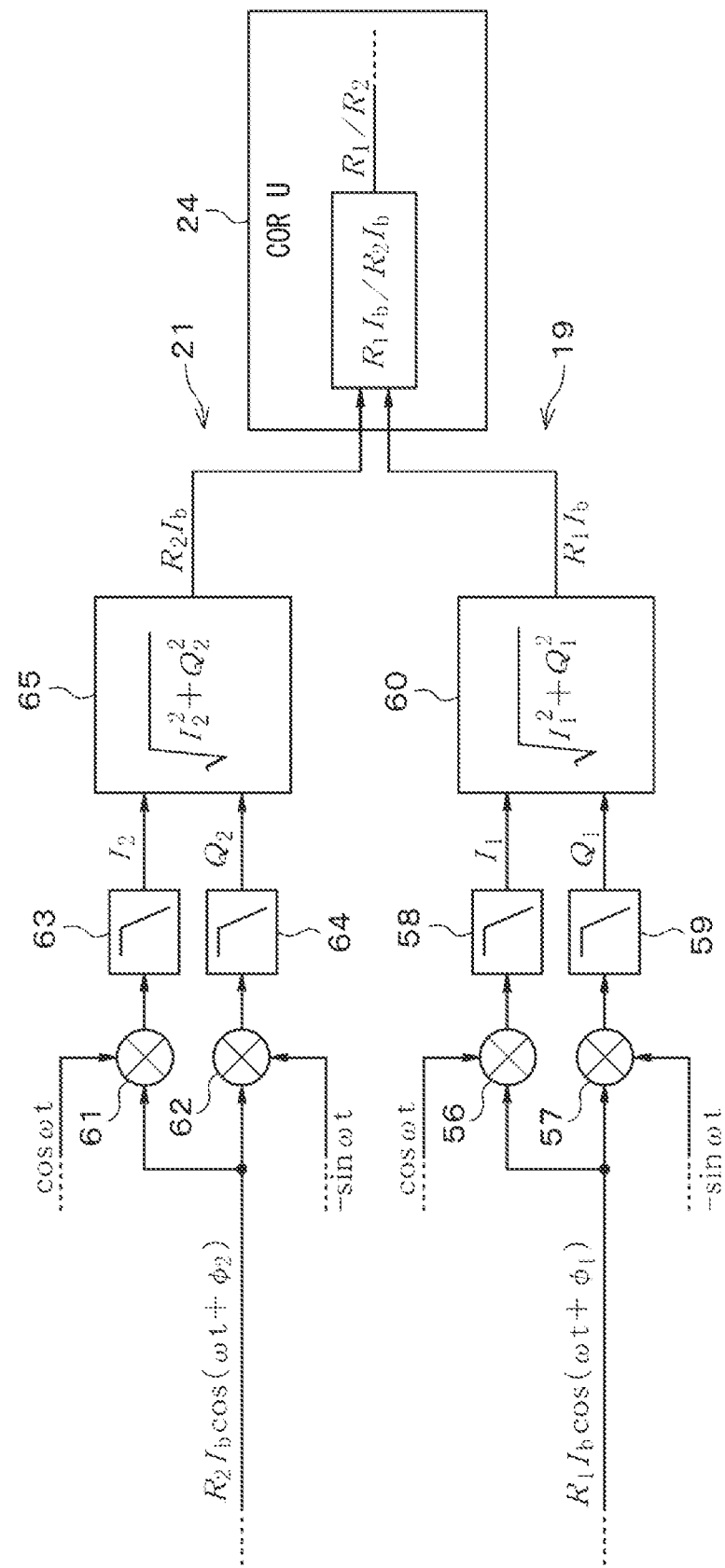
FIG. 5 is a specific second configuration example of each synchronous detection circuit according to the first embodiment.

A specific configuration of the first synchronous detection circuit 17 and the second synchronous detection circuit 19 includes, for example, the configuration shown in FIG. 4. Further, a specific configuration of the second synchronous detection circuit 19 and the third synchronous detection circuit 21 includes, for example, the configuration as shown in FIG. 5. In the above configuration, the first synchronous detection circuit 17 and the second synchronous detection circuit 19 operate in the first period, and the second synchronous detection circuit 19 and the third synchronous detection circuit 21 operate in the second period. Therefore, in the following, the configuration and operation of each synchronous detection circuit that operates in each of the first period and the second period will be described.

[1] First Period

The specific configuration and operation of the first synchronous detection circuit 17 and the second synchronous detection circuit 19 in the first period at the time of correction are as shown in FIG. 4. In this case, the alternating current signal, which is the AC current applied to the series circuit of the shunt resistor 4 and the correction resistor 5 by the first signal application unit 7, is defined as "Ia·cos ($\omega$t)", and the resistance value of the shunt resistor 4 is defined as R, and the resistance value of the correction resistor 5 is defined as R1. Here, $\omega$ is an angular frequency and t is a time.

As shown in FIG. 4, the first synchronous detection circuit 17 includes multipliers 51 and 52, low-pass filters 53 and 54, and an arithmetic unit 55. In this specification, the low-pass filter may be abbreviated as LPF. During the first period at the time of correction when the AC signal is applied to the series circuit of the shunt resistor 4 and the correction resistor 5, the digital signal output from the first A/D converter 16 is input into each one input terminal of the multipliers 51 and 52 of the first synchronous detection circuit 17. This digital signal is a signal corresponding to the terminal voltage of the shunt resistor 4 in the first period at the time of correction, and is defined as "R·Ia·cos ($\omega$t+$\varphi$)":

A cosine wave signal of "cos ($\omega$t)" is input to the other input terminal of the multiplier 51. A sine wave signal of "−sin ($\omega$t)" is input to the other input terminal of the multiplier 52. As a result, in each output signal of the multipliers 51 and 52, the signal having the angular frequency $\omega$ is extracted as a direct current component. The output signals of the multipliers 51 and 52 are input to the LPFs 53 and 54, respectively.

The output signal I of the LPF 53 is a low frequency signal proportional to the in-phase component of the input signal, and the output signal Q of the LPF 54 is a low frequency signal proportional to the orthogonal phase component of the input signal. The arithmetic unit 55 calculates the square root of the sum of squares of the signal I and the signal Q, and outputs a signal representing the calculation result. The output signal of the arithmetic unit 55 is expressed as "R·Ia". The output signal of the arithmetic unit 55 becomes an output signal of the first synchronous detection circuit 17, and is given to the correction unit 24 of the control unit 12.

The second synchronous detection circuit 19 includes multipliers 56 and 57, low-pass filters 58 and 59, and an arithmetic unit 60. During the first period at the time of correction when the AC signal is applied to the series circuit of the shunt resistor 4 and the correction resistor 5, the digital signal output from the second A/D converter 18 is input into each one input terminal of the multipliers 56 and 57 of the second synchronous detection circuit 19. This digital signal is a signal corresponding to the terminal voltage of the correction resistor 5 in the first period at the time of correction, and is defined as "R1·Ia·cos ($\omega$t+$\varphi$1)".

A cosine wave signal of "cos ($\omega$t)" is input to the other input terminal of the multiplier 56. A sine wave signal of "−sin ($\omega$t)" is input to the other input terminal of the multiplier 57. As a result, in each output signal of the multipliers 56 and 57, the signal having the angular frequency $\omega$ is extracted as a direct current component. The output signals of the multipliers 56 and 57 are input to the LPFs 58 and 59, respectively.

The output signal I1 of the LPF 58 is a low frequency signal proportional to the in-phase component of the input signal, and the output signal Q1 of the LPF 59 is a low frequency signal proportional to the orthogonal phase component of the input signal. The arithmetic unit 60 calculates the square root of the sum of squares of the signal I1 and the signal Q1, and outputs a signal representing the calculation result. The output signal of the arithmetic unit 60 is expressed as "R1·Ia". The output signal of the arithmetic unit 60 becomes an output signal of the second synchronous detection circuit 19, and is given to the correction unit 24 of the control unit 12.

[2] Second Period

The specific configuration and operation of the second synchronous detection circuit 19 and the third synchronous detection circuit 21 in the second period at the time of correction are as shown in FIG. 5. In this case, the AC signal which is the alternating current applied to the series circuit of the shunt resistor 4 and the correction resistors 5 and 6 by the second signal application unit 8 is defined as "Ib·cos ($\omega$t)", and the resistance value of the correction resistor 6 is defined as R2.

As shown in FIG. 5, during the second period at the time of correction when the AC signal is applied to the series circuit of the shunt resistor 4 and the correction resistors 5 and 6, the digital signal output from the second A/D converter 18 is input into each one input terminal of the multipliers 56 and 57 of the second synchronous detection circuit 19. This digital signal is a signal corresponding to the terminal voltage of the correction resistor 5 in the second period at the time of correction, and is defined as "R1·Ib·cos ($\omega$t+$\varphi$1)".

A cosine wave signal of "cos ($\omega$t)" is input to the other input terminal of the multiplier 56. A sine wave signal of "−sin ($\omega$t)" is input to the other input terminal of the multiplier 57. As a result, in each output signal of the multipliers 56 and 57, the signal having the angular frequency $\omega$ is extracted as a direct current component. The output signals of the multipliers 56 and 57 are input to the LPFs 58 and 59, respectively.

The output signal I1 of the LPF 58 is a low frequency signal proportional to the in-phase component of the input signal, and the output signal Q1 of the LPF 59 is a low frequency signal proportional to the orthogonal phase component of the input signal. The arithmetic unit 60 calculates the square root of the sum of squares of the signal I1 and the signal Q1, and outputs a signal representing the calculation result. The output signal of the arithmetic unit 60 is expressed as "R1·Ib". The output signal of the arithmetic unit 60 becomes an output signal of the second synchronous detection circuit 19, and is given to the correction unit 24 of the control unit 12.

The third synchronous detection circuit 21 includes multipliers 61 and 62, low-pass filters 63 and 64, and an arithmetic unit 65. During the second period at the time of correction when the AC signal is applied to the series circuit of the shunt resistor 4 and the correction resistors 5 and 6, the digital signal output from the third A/D converter 20 is input into each one input terminal of the multipliers 61 and 62 of the third synchronous detection circuit 21. This digital signal is a signal corresponding to the terminal voltage of the correction resistor 6 in the second period at the time of correction, and is defined as "R2·Ib·cos ($\omega$t+$\varphi$2)".

A cosine wave signal of "cos ($\omega$t)" is input to the other input terminal of the multiplier 61. A sine wave signal of "−sin ($\omega$t)" is input to the other input terminal of the multiplier 62. As a result, in each output signal of the multipliers 61 and 62, the signal having the angular frequency $\omega$ is extracted as a direct current component. The output signals of the multipliers 61 and 62 are input to the LPFs 63 and 64, respectively.

The output signal I2 of the LPF 63 is a low frequency signal proportional to the in-phase component of the input signal, and the output signal Q2 of the LPF 64 is a low frequency signal proportional to the orthogonal phase component of the input signal. The arithmetic unit 65 calculates the square root of the sum of squares of the signal I2 and the signal Q2, and outputs a signal representing the calculation result. The output signal of the arithmetic unit 65 is expressed as "R2·Ib". The output signal of the arithmetic unit 65 becomes an output signal of the third synchronous detection circuit 21, and is given to the correction unit 24 of the control unit 12.

<Specific Operation by the Correction Unit>

The correction unit 24 calculates a calculation resistance value as follows specifically based on each signal given from the first synchronous detection circuit 17, the second synchronous detection circuit 19, and the third synchronous detection circuit 21 in the first period and the second period as described above. That is, the correction unit 24 divides the output signal "R1·Ia" of the first synchronous detection circuit 17 in the first period by the output signal "R1·Ia" of the second synchronous detection circuit 19 in the first period, so that the correction unit 24 obtains the value "R/R1" representing the ratio of each resistance value of the shunt resistor 4 and the correction resistor 5. Further, the correction unit 24 divides the output signal "R1·Ib" of the second synchronous detection circuit 19 in the second period by the output signal "R2·Ib" of the third synchronous detection circuit 21 in the second period, so that the correction unit 24 obtains the value "R1/R2" representing the ratio of each resistance value of the correction resistor 5 and the correction resistor 6.

Further, the correction unit 24 obtains a value "R/R2" representing the ratio of each resistance value of the shunt resistor 4 and the correction resistor 6 by multiplying the value "R/R1" and the value "R1/R2". Here, the resistance value R2 of the correction resistor 6 is a known value and is stored in advance in the memory of the control unit 12 or the like. Therefore, the correction unit 24 multiplies the value "R/R2" obtained as described above by the resistance value R2 stored in advance, so that the resistance value R of the shunt resistor 4 at the present time, that is, the calculation resistance value can be calculated.

The above-described embodiment provides the following effect.

A current sensor 1 according to the present embodiment detects a detection target current based on a terminal voltage of a shunt resistor 4 provided in series in a path through which the detection target current flows and a resistance value for current detection corresponding to a resistance value of the shunt resistor 4. The current sensor includes a resistance value correction circuit 25 for correcting the resistance value for current detection. The resistance value correction circuit 25 includes a plurality of correction resistors 5 and 6, a signal application unit 15, a voltage detection unit 22, and a correction unit 24. The plurality of correction resistors 5, 6 are all connected in series together with the shunt resistor 4 in a path different from the path through which the detection target current flows, and the resistance accuracy thereof is higher than that of the shunt resistor 4.

The signal application unit 15 applies an alternating current signal to all or a part of the series circuit of the shunt resistor 4 and the correction resistors 5, 6. The voltage detection unit 22 detects the terminal voltage of the shunt resistor 4 and the terminal voltage of the correction resistor 5 in the first period in which the AC signal is applied to the shunt resistor 4 and the correction resistor 5. Further, the voltage detection unit 22 detects the terminal voltage of the correction resistors 5 and 6 in the second period in which the AC signal is applied to the shunt resistor 4 and the correction resistors 5 and 6. The correction unit 24 calculates the resistance value of the shunt resistor 4 based on the detection value of the terminal voltage by the voltage detection unit 22 in the first period and the detection value of the terminal voltage by the voltage detection unit 22 in the second period, and also corrects the resistance value for the detection based on the calculated resistance value as the calculated resistance of the shunt resistor 4.

According to such a configuration, it is possible to directly correct the resistance value for detection by using the shunt resistor 4 without indirectly correcting the resistance value for detection by using the sub-resistors as in the first conceivable technique. Further, according to the above configuration, unlike the second conceivable technique, it is not necessary to provide a plurality of shunt resistors nor to provide an input terminal at the center of the shunt resistors, and only one shunt resistor 4 needs to be provided, so that the configuration of the entire current sensor 1 is not complicated.

Further, according to the above configuration, the calculation accuracy of the calculated resistance value and the correction accuracy of the resistance value for detection depend greatly on the accuracy of the resistance value R2 of the correction resistor 6 among the plurality of correction resistors 5, 6 disposed far from the shunt resistor 4 in the series circuit and the detection accuracy of the terminal voltage by the voltage detection unit 22. In this case, the resistance value and the resistance value accuracy of the plurality of correction resistors 5, 6 are higher as they are farther from the shunt resistor 4 in the series circuit. In general, it may be difficult to accurately form a resistor having a small resistance value, but it may be relatively easy to accurately form a resistor having a large resistance value.

Therefore, according to the above configuration, it is possible to sufficiently improve the accuracy of the resistance value R2 of the correction resistor 6 far from the shunt resistor 4, which is greatly related to the accuracy of the correction of the resistance value for detection, and as a result, the accuracy of correction of the resistance value for detection is sufficiently improved. Therefore, according to the above embodiment, it is possible to obtain an excellent effect that the resistance value for detection can be corrected with high accuracy without complicating the configuration of the entire current sensor 1.

In this case, the voltage detection unit 22 inputs the signal of the terminal of the shunt resistor 4, synchronously detects the signal at the same frequency as the AC signal, and extracts the signal, and detects the terminal voltage of the shunt resistor 4 based on the extracted signal. Further, the voltage detection unit 22 inputs the signals of the terminals of the correction resistors 5 and 6, and synchronously detect the signal at the same frequency as the AC signal to extract the signal, and output the signal, and detects the terminal voltage of the correction resistors 5 and 6 based on the extracted signal.

According to such a configuration, the terminal voltages of the shunt resistor 4 and the correction resistors 5 and 6 are detected based on the signal extracted by synchronous detection at the same frequency as the frequency of the AC signal applied to the shunt resistor 4 and the correction resistors 5 and 6. Therefore, according to the present embodiment, the detection accuracy of the detection value of each terminal voltage by the voltage detection unit 22 is restricted from being reduced due to the influence of noise such as thermos-electromotive force and an offset on the circuit side, and as a result, the accuracy of correction of the resistance value for detection can be further improved.

The signal application unit 15 applies a pulse wave signal or a sine wave AC signal to all or a part of the series circuit of the shunt resistor 4 and the correction resistors 5 and 6. When the signal application unit 15 applies a sine wave AC signal, the configuration for generating the AC signal, specifically, the configuration of the signal generation units 33 and 37 is complicated, but the signal includes only a frequency component desired as an AC signal. Thus, the detection error of the detection value of each terminal voltage by the voltage detection unit 22 can be suppressed to a low level, in other words, the accuracy of correction of the resistance value for detection can be improved.

On the other hand, when the signal application unit 15 applies a pulse wave AC signal, an error may occur in the detection value of each terminal voltage by the voltage detection unit 22 because the AC signal includes a harmonic component. However, the configuration for generating an AC signal, specifically, the configuration of the signal generation units 33 and 37 can be simplified.

The current sensor 1 of the present embodiment has a configuration including a plurality of correction resistors 5 and 6, alternatively, one of the correction resistors 5 and 6 may be removed from the current sensor 1 of the present embodiment and a configuration related to the one of the correction resistors 5 and 6 may be also removed, that is, a configuration includes only one correction resistor. Even in such a case, it is considered that the accuracy of correction of the resistance value for detection can be improved as in the present embodiment. Hereinafter, a configuration having such one correction resistor will be referred to as a comparative example. Here, according to this embodiment, the following effects that cannot be obtained in the comparative example can be obtained.

That is, in the comparative example, when the detection value of the terminal voltage of the shunt resistor 4 is increased at the time of correction to improve the detection accuracy, the ratio of each resistance value of the shunt resistor 4 and the correction resistor is set to, for example, "1:1000", "1:10000", and the like, so that the ratio must be very large. Here, assuming that the voltage detection ranges of the ADCs constituting the voltage detection unit 22 are in the same range, it is necessary to match the detection range with the range in which the terminal voltage of the correction resistor can be detected. Therefore, in the comparative example, it may be difficult to accurately detect each terminal voltage of the shunt resistor 4 and the correction resistor unless an ADC having a very high resolution is adopted.

On the other hand, in the present embodiment, when the detection value of the terminal voltage of the shunt resistor 4 is increased at the time of correction to improve the detection accuracy, the ratio of the resistance values of the shunt resistor 4 and the correction resistor 5 and the ratio of the resistance values of the correction resistors 5 and 6 can be suppressed to a relatively small value such as "1:100" or "1:10". Therefore, in the present embodiment, even if an ADC having a very high resolution is not adopted, the same ADC is used as each ADC constituting the voltage detection unit 22, and the terminal voltages of the shunt resistor 4 and the correction resistors 5 and 6 are detected with high accuracy, which is an excellent effect.

Second Embodiment

Figure 6:
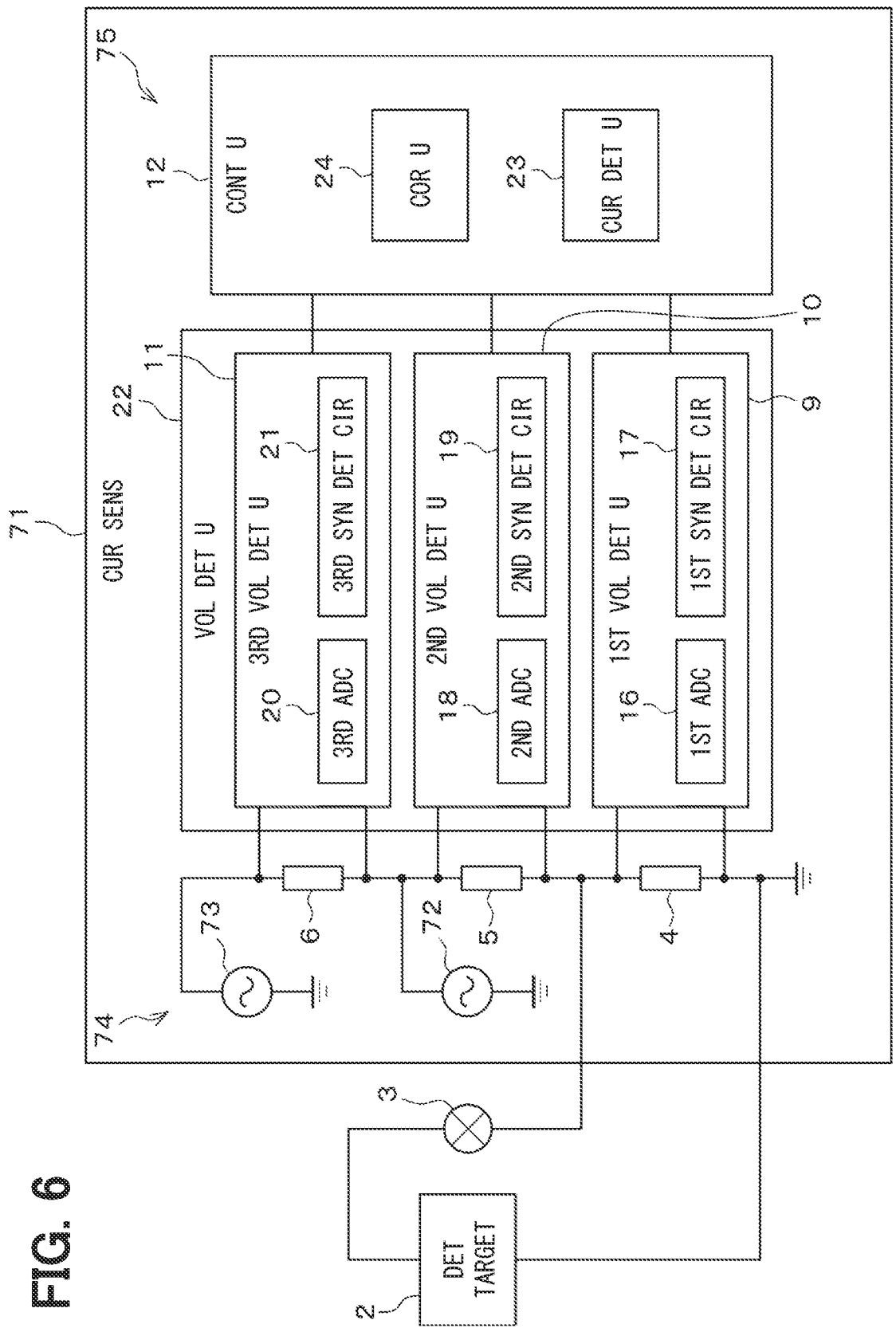
FIG. 6 is a diagram schematically showing a configuration of a current sensor according to a second embodiment.
Figure 7:
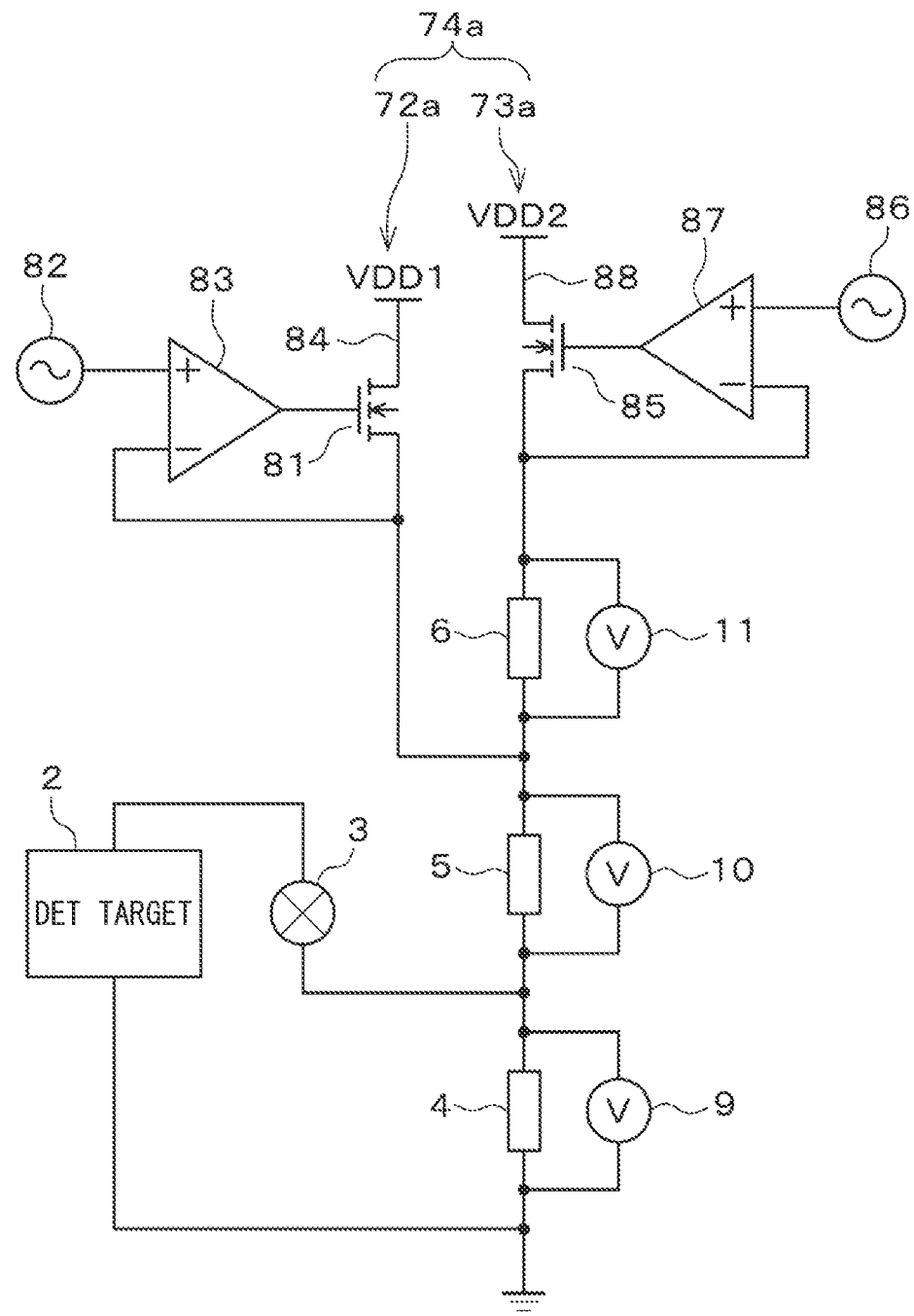
FIG. 7 is a diagram showing a specific first configuration example of the signal application unit according to the second embodiment.
Figure 8:
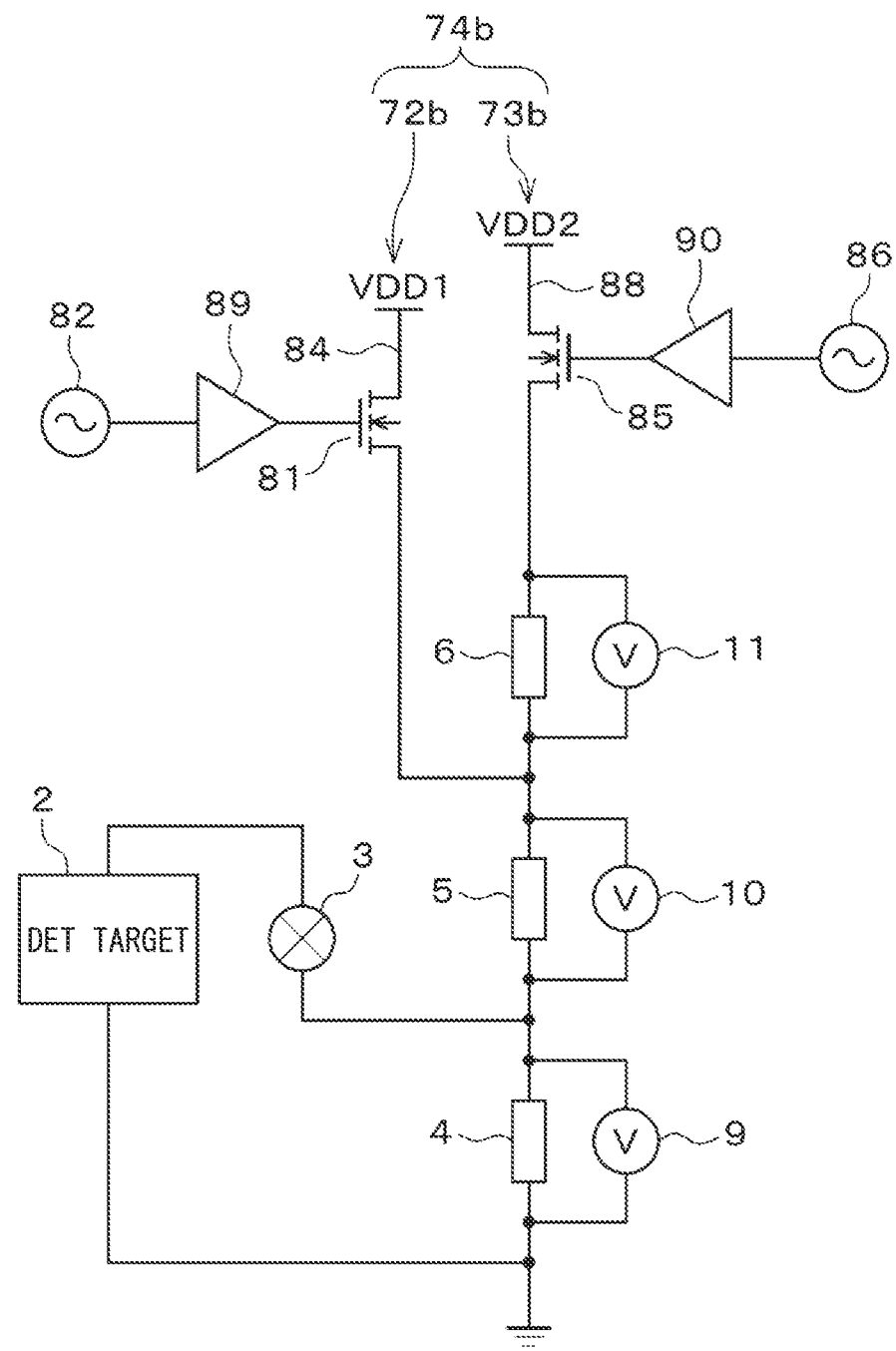
FIG. 8 is a diagram showing a specific second configuration example of the signal application unit according to the second embodiment.

The following describes a second embodiment with reference to FIGS. 6 to 8.

(General Configuration)

As shown in FIG. 6, the current sensor 71 of the present embodiment is different from the current sensor 1 of the first embodiment shown in FIG. 1 such that the signal application unit 72 and the second signal application unit 73 are provided in stead of the first signal application unit 7 and the second signal application unit 8.

Similar to the first signal application unit 7, the first signal application unit 72 applies a pulse wave signal or a sine wave AC signal to the series circuit of the shunt resistor 4 and the correction resistor 5 at the time of correction. In this case, the first signal application unit 72 is configured as a voltage source for supplying an AC voltage to the series circuit of the shunt resistor 4 and the correction resistor 5. The second signal application unit 73 is configured as a voltage source for supplying an AC voltage to the series circuit of the shunt resistor 4 and the correction resistors 5 and 6. Similar to the second signal application unit 8, the second signal application unit 73 applies a pulse wave signal or a sine wave AC signal to the series circuit of the shunt resistor 4 and the correction resistors 5 and 6 at the time of correction. In this case, the second signal application unit 73 is configured as a voltage source for supplying an AC voltage to the series circuit of the shunt resistor 4 and the correction resistors 5 and 6.

As described above, in the present embodiment, the first signal application unit 72 and the second signal application unit 73 apply an AC signal to all or a part of the series circuit of the shunt resistor 4 and the plurality of correction resistors 5 and 6, and function as a signal application unit 74. In the above configuration, the resistance value correction circuit 75 for correcting the resistance value for detection is configured by the correction resistors 5 and 6, the signal application unit 74, the voltage detection unit 22, and the correction unit 24.

<Specific Configuration of Signal Application Unit>

Specific examples of the signal application unit 74 include a first configuration example shown in FIG. 7, a second configuration example shown in FIG. 8, and the like.

[1] First Configuration Example

As shown in FIG. 7, the first signal application unit 72a in the signal application unit 74a of the first configuration example includes a transistor 81, a signal generation unit 82, an operational amplifier 83, and the like. The transistor 81 is, for example, an N-channel MOSFET, its drain is connected to a power supply line 84 to which a power supply voltage VDD1 is supplied, and its source is connected to ground via a correction resistor 5 and a shunt resistor 4.

The signal generation unit 82 generates and outputs a pulse wave signal or a sine wave signal having the same frequency as the alternating current voltage applied to the series circuit of the shunt resistor 4 and the correction resistor 5. The output signal of the signal generation unit 82 is given to the non-inverting input terminal of the OP amplifier 83. The inverting input terminal of the OP amplifier 83 is connected to the source of the transistor 81, and its output terminal is connected to the gate of the transistor 81. According to the above configuration, the transistor 81 is driven by the OP amplifier 83, so that an AC signal, which is an alternating current voltage, is applied to the series circuit of the shunt resistor 4 and the correction resistor 5.

Further, the second signal application unit 73a in the signal application unit 74a of the first configuration example includes a transistor 85, a signal generation unit 86, an operational amplifier 87, and the like. The transistor 85 is, for example, an N-channel MOSFET, its drain is connected to a power supply line 88 to which a power supply voltage VDD2 is supplied, and its source is connected to ground via correction resistors 5 and 6 and a shunt resistor 4.

The signal generation unit 86 generates and outputs a pulse wave signal or a sine wave signal having the same frequency as the alternating current voltage applied to the series circuit of the shunt resistor 4 and the correction resistors 5 and 6. The output signal of the signal generation unit 86 is given to the non-inverting input terminal of the OP amplifier 87. The inverting input terminal of the OP amplifier 87 is connected to the source of the transistor 85, and its output terminal is connected to the gate of the transistor 85. According to the above configuration, the transistor 85 is driven by the OP amplifier 87, so that an AC signal, which is an alternating current voltage, is applied to the series circuit of the shunt resistor 4 and the correction resistors 5 and 6. As described above, the first signal application unit 72a and the second signal application unit 73a in the signal application unit 74a of the first configuration example are both configured to be driven by an amplifier.

[2] Second Configuration Example

As shown in FIG. 8, in the first signal application unit 72b in the signal application unit 74b of the second configuration example, the buffer 89 in place of the OP amplifier 83 is arranged with respect to the first signal application unit 72a of the first configuration example shown in FIG. 7, which is different from the first configuration example. In this case, the output signal of the signal generation unit 82 is given to the input terminal of the buffer 89. The output terminal of the buffer 89 is connected to the gate of the transistor 81. According to the above configuration, the transistor 81 is driven by the buffer 89, so that an AC signal, which is an alternating current voltage, is applied to the series circuit of the shunt resistor 4 and the correction resistor 5.

Further, in the second signal application unit 73b in the signal application unit 74b of the second configuration example, the buffer 90 in place of the OP amplifier 87 is arranged with respect to the second signal application unit 73a of the first configuration example shown in FIG. 7, which is different from the first configuration example. In this case, the output signal of the signal generation unit 86 is given to the input terminal of the buffer 90. The output terminal of the buffer 90 is connected to the gate of the transistor 85. According to the above configuration, the transistor 85 is driven by the buffer 90, so that an AC signal, which is an alternating current voltage, is applied to the series circuit of the shunt resistor 4 and the correction resistors 5 and 6. As described above, the first signal application unit 72b and the second signal application unit 73b in the signal application unit 74b of the second configuration example are both buffer-driven.

[3] Features of Each Configuration Example

According to the first configuration example of the amplifier drive configuration, the source voltages of the transistors 81 and 85 are controlled to be constant by the operation of the OP amplifiers 83 and 87, so that the first configuration example has a merit, compared with the second configuration example of the buffer drive configuration, such that the accuracy of the AC current voltage applied to the series circuit of the shunt resistor 4 and the correction resistors 5 and 6 can be improved. On the other hand, according to the second configuration example, there is an advantage that the circuit scale can be suppressed to be a smaller size by using the buffers 89 and 90 instead of the OP amplifiers 83 and 87 as compared with the first configuration example.

As described above, the current sensor 71 of the present embodiment includes a resistance value correction circuit 75 capable of performing the same operation as the resistance value correction circuit 25 of the first embodiment except for the feature such that the AC signal applied to all or a part of the series circuit of the shunt resistor 4 and the correction resistors 5 and 6 is changed from the AC current to the AC voltage at the time of correction in the first embodiment. Therefore, also in this embodiment, it is possible to correct the resistance value for detection in the same manner as in the first embodiment, and the same effect as in the first embodiment can be obtained.

Third Embodiment

A third embodiment will be described below with reference to FIG. 9.

Figure 9:
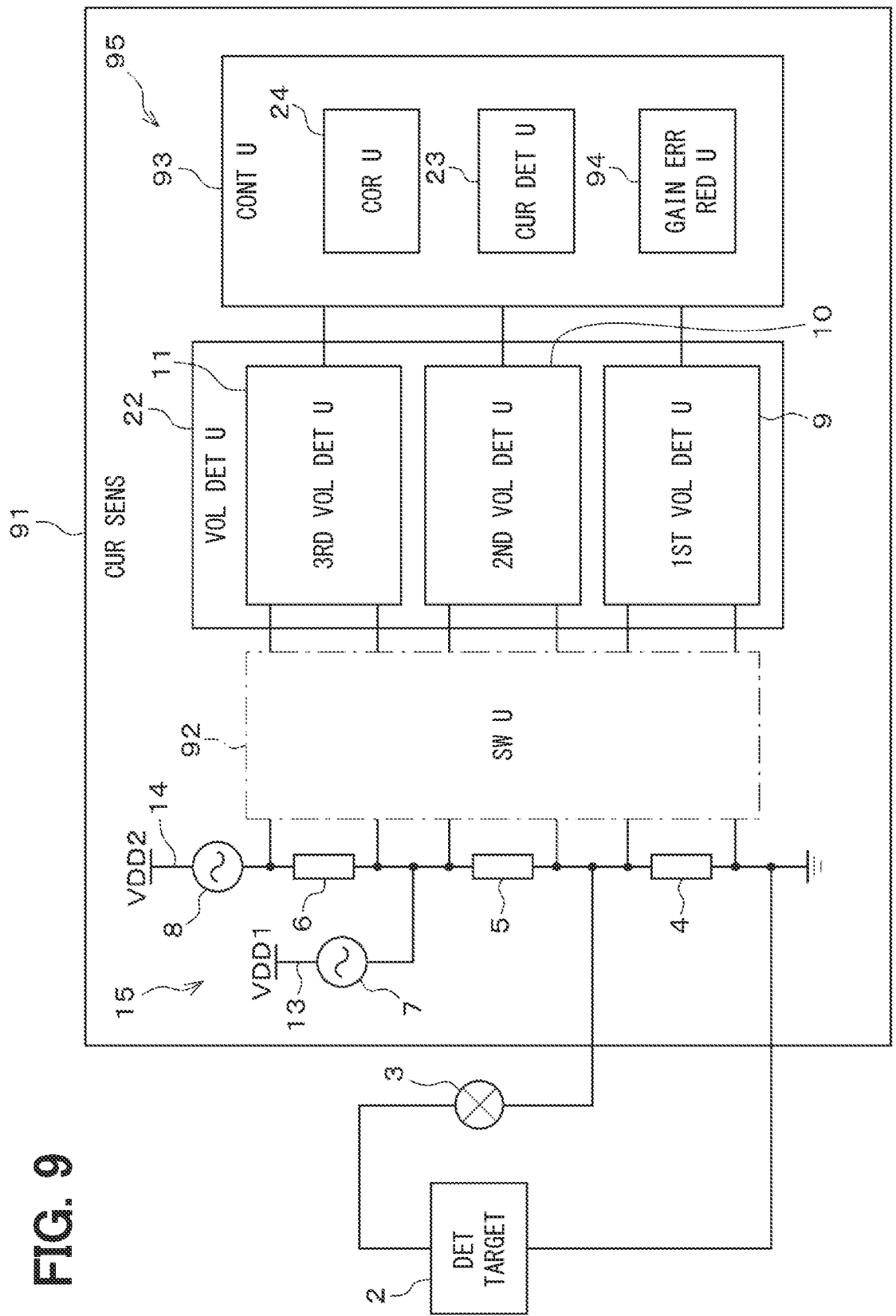
FIG. 9 is a diagram schematically showing a configuration of a current sensor according to a third embodiment.

As shown in FIG. 9, the current sensor 91 of the present embodiment has a switching unit 92 added to the current sensor 1 of the first embodiment shown in FIG. 1, and has a control unit 93 instead of the control unit 12, which are different from the first embodiment. The switching unit 92 includes, for example, a multiplexer or the like, and switches the connection state between each terminal of the shunt resistor 4, the correction resistors 5, and 6 and each input terminal of the voltage detection unit 22. The operation of the switching unit 92 is controlled by the control unit 93.

In the connection state of the switching unit 92, each of the first voltage detection unit 9, the second voltage detection unit 10, and the third voltage detection unit 11 are switchable in order to detect each of the terminal voltages of the shunt resistor 4, the correction resistor 5, and the correction resistor 6. As for the connection state of the switching unit 92, for example, they are switched so that the first voltage detection unit 9 detects the terminal voltage of the shunt resistor 4, the second voltage detection unit 10 detects the terminal voltage of the correction resistor 5, and the third voltage detection unit 11 detects the terminal voltage of the correction resistor 6. As for the connection state of the switching unit 92, for example, they may be switched so that the first voltage detection unit 9 detects the terminal voltage of the shunt resistor 4, the second voltage detection unit 10 detects the terminal voltage of the correction resistor 6, and the third voltage detection unit 11 detects the terminal voltage of the correction resistor 5.

Further, as for the connection state of the switching unit 92, for example, they may be switched so that the first voltage detection unit 9 detects the terminal voltage of the correction resistor 5, the second voltage detection unit 10 detects the terminal voltage of the shunt resistor 4, and the third voltage detection unit 11 detects the terminal voltage of the correction resistor 6. As for the connection state of the switching unit 92, for example, they may be switched so that the first voltage detection unit 9 detects the terminal voltage of the correction resistor 5, the second voltage detection unit 10 detects the terminal voltage of the correction resistor 6, and the third voltage detection unit 11 detects the terminal voltage of the shunt resistor 4.

As for the connection state of the switching unit 92, for example, they may be switched so that the first voltage detection unit 9 detects the terminal voltage of the correction resistor 6, the second voltage detection unit 10 detects the terminal voltage of the shunt resistor 4, and the third voltage detection unit 11 detects the terminal voltage of the correction resistor 5. As for the connection state of the switching unit 92, for example, they may be switched so that the first voltage detection unit 9 detects the terminal voltage of the correction resistor 6, the second voltage detection unit 10 detects the terminal voltage of the correction resistor 5, and the third voltage detection unit 11 detects the terminal voltage of the shunt resistor 4.

Further, the connection state of the switching unit 92 may be switched so that at least two of the first voltage detection unit 9, the second voltage detection unit 10, and the third voltage detection unit 11 detect the terminal voltage of the shunt resistor 4. Further, the connection state of the switching unit 92 may be switched so that at least two of the first voltage detection unit 9, the second voltage detection unit 10, and the third voltage detection unit 11 detect the terminal voltage of the correction resistor 5. Further, the connection state of the switching unit 92 may be switched so that at least two of the first voltage detection unit 9, the second voltage detection unit 10, and the third voltage detection unit 11 detect the terminal voltage of the correction resistor 6.

The control unit 93 is different from the control unit 12 in that a functional block of a gain error reduction unit 94 is added. In the above configuration, the resistance value correction circuit 95 that corrects the resistance value for detection is configured by the correction resistors 5 and 6, the signal application unit 15, the voltage detection unit 22, the correction unit 24, the switching unit 92, and the gain error reduction unit 94. The gain error reduction unit 94 includes a first A/D converter 16 of the first voltage detection unit 9, a second A/D converter 18 of the second voltage detection unit 10, and a third A/D converter of the third voltage detection unit 11. 20, so that the gain error of each ADC is reduced.

In the following description, when it is not necessary to distinguish between the first A/D converter 16, the second A/D converter 18, and the third A/D converter 20, they may be collectively referred to as ADC. Further, in the following description, when it is not necessary to distinguish between the first voltage detection unit 9, the second voltage detection unit 10, and the third voltage detection unit 11, they may be collectively referred to as a voltage detection unit.

When the gain error reduction unit 94 does not perform an operation for reducing the gain error, the connection state of the switching unit 92 is switched so that the first voltage detection unit 9 detects the terminal voltage of the shunt resistor 4, and the second voltage detection unit 10 detects the terminal voltage of the correction resistor 5, and the third voltage detection unit 11 detects the terminal voltage of the correction resistor 6. Then, the gain error reduction unit 94 can reduce the gain error of each ADC by switching the connection state of the switching unit 92 as follows.

That is, the gain error reduction unit 94, for example, switches the connection state of the switching unit 92 so that two of the voltage detection units detect the terminal voltage of the shunt resistor 4, the correction resistor 5, or the correction resistor 6. As a result, the gain error reduction unit 94 can reduce the relative gain error of each ADC based on the detected values of the terminal voltages of the shunt resistor 4, the correction resistor 5 or the correction resistor 6 detected by each of the two voltage detection units. In this case, the gain error reduction unit 94 can make corrections so that the gains of the ADCs are the same, for example.

Further, in the gain error reduction unit 94, for example, the connection state of the switching unit 92 is switched such that the first voltage detection unit 9 detects the terminal voltage of the shunt resistor 4 and the second voltage detection unit 10 detects the terminal voltage of the correction resistor 5. After that, the connection state of the switching unit 92 is switched such that the first voltage detection unit 9 detects the terminal voltage of the correction resistor 5 and the second voltage detection unit 10 detects the terminal voltage of the shunt resistor 4. As a result, the gain error reduction unit 94 reduces the gain errors of the first A/D converter 16 and the second A/D converter 18 based on the respective detection values of the terminal voltage of the shunt resistor 4 detected by each of the first voltage detection unit 9 and the second voltage detection unit 10.

Further, the gain error reduction unit 94 reduces the gain errors of the first A/D converter 16 and the second A/D converter 18 based on the respective detection values of the terminal voltage of the correction resistor 5 detected by each of the first voltage detection unit 9 and the second voltage detection unit 10. In these cases, the gain error reduction unit 94 can reduce the gain error by, for example, averaging the two detected values to cancel each gain error.

As described above, the resistance value correction circuit 95 of the current sensor 91 of the present embodiment includes a gain error reducing unit 94 for reducing each gain error of the first A/D converter 16 of the first voltage detection unit 9, the second A/D converter 18 of the second voltage detection unit 10 and the third A/D converter 20 of the third voltage detection unit 11. According to such a configuration, the gain errors of the first A/D converter 16, the second A/D converter 18, and the third A/D converter 20 can be reduced to a very small value such as 0.1%. Therefore, according to the present embodiment, the detection accuracy of the terminal voltages of the shunt resistor 4 and the correction resistors 5 and 6 by the voltage detection unit 22 is further improved, and as a result, the correction accuracy of the resistance value for detection is further improved.

Fourth Embodiment

Figure 10:
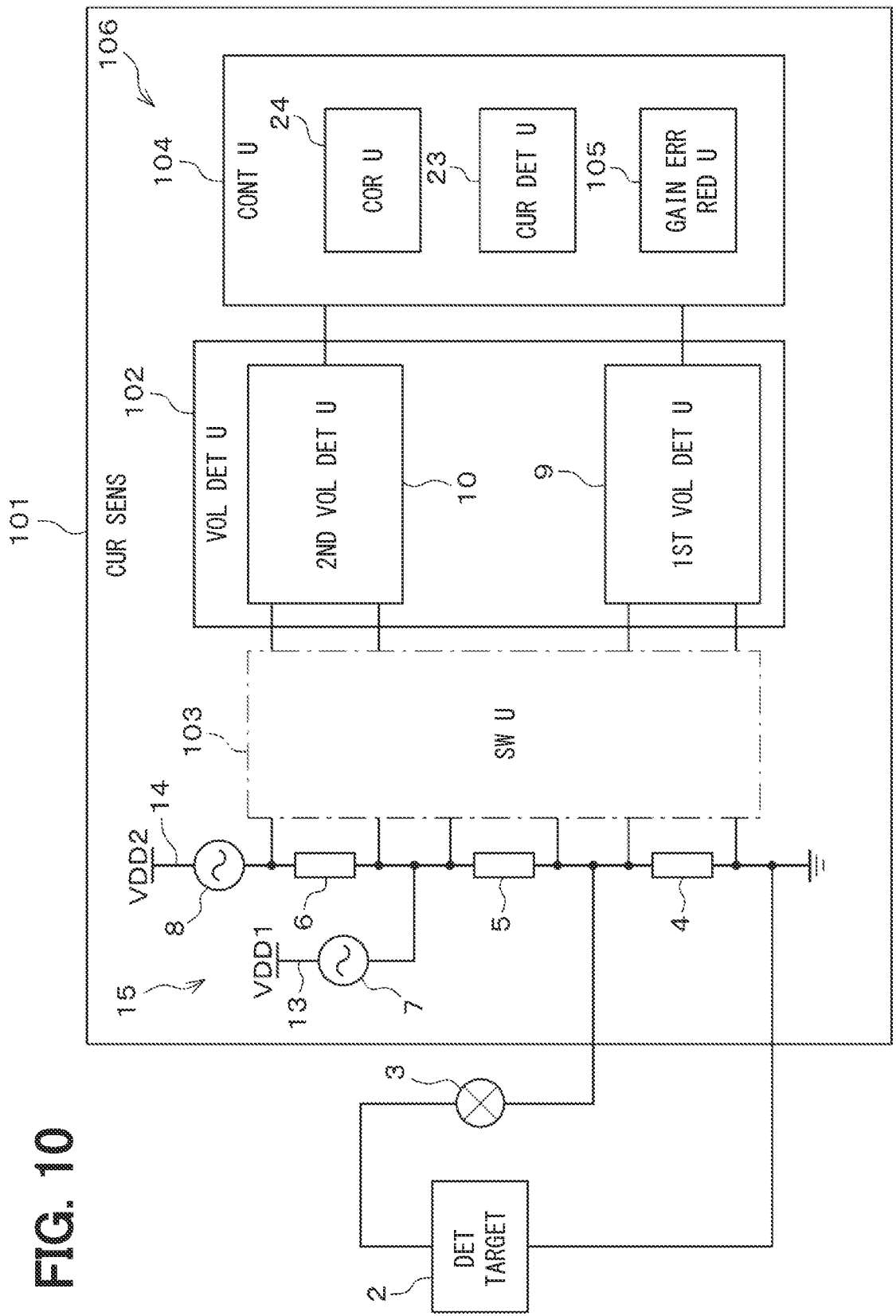
FIG. 10 is a diagram schematically showing a configuration of a current sensor according to a fourth embodiment.
Figure 11:
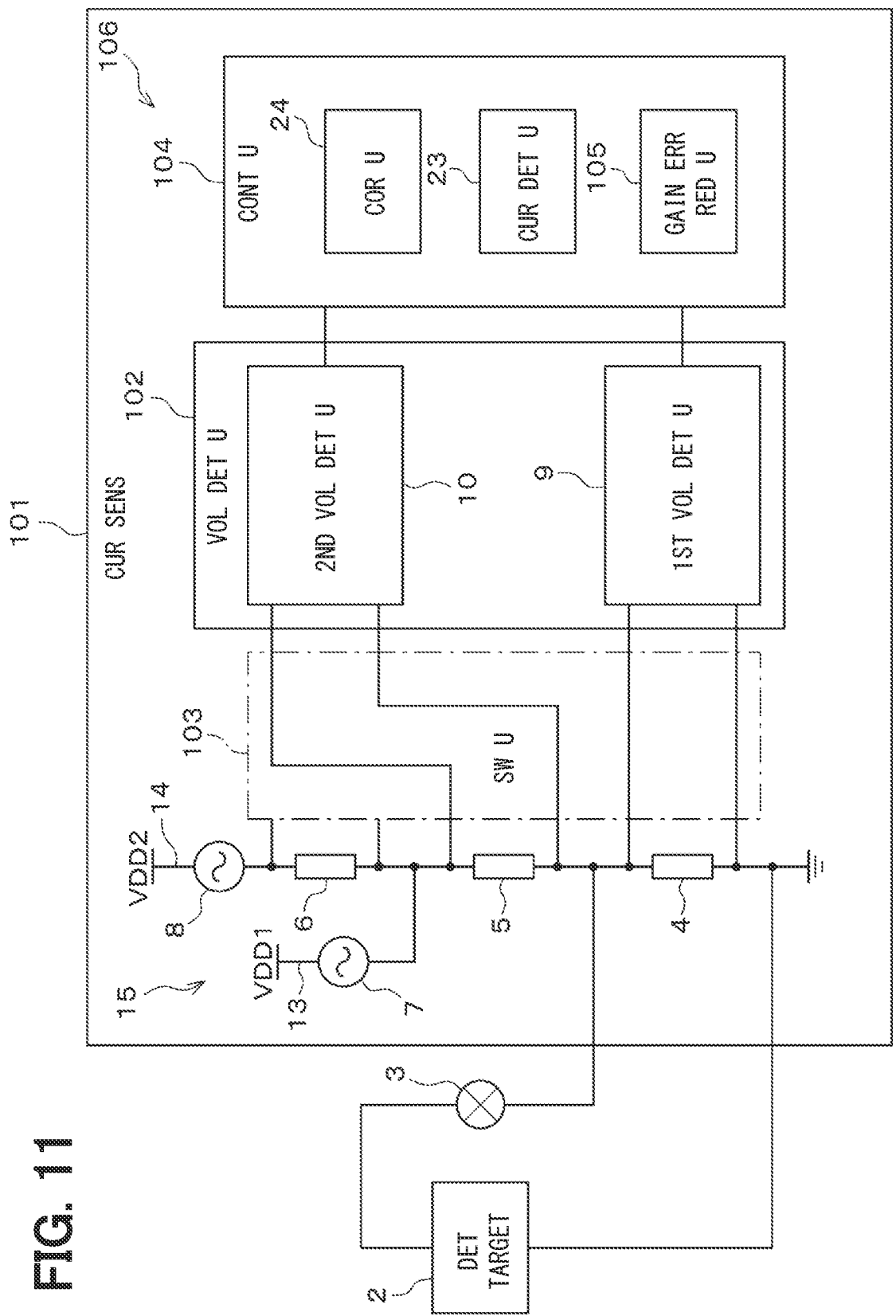
FIG. 11 is a diagram schematically showing a configuration of a current sensor switched to a first connection state according to the fourth embodiment.
Figure 12:
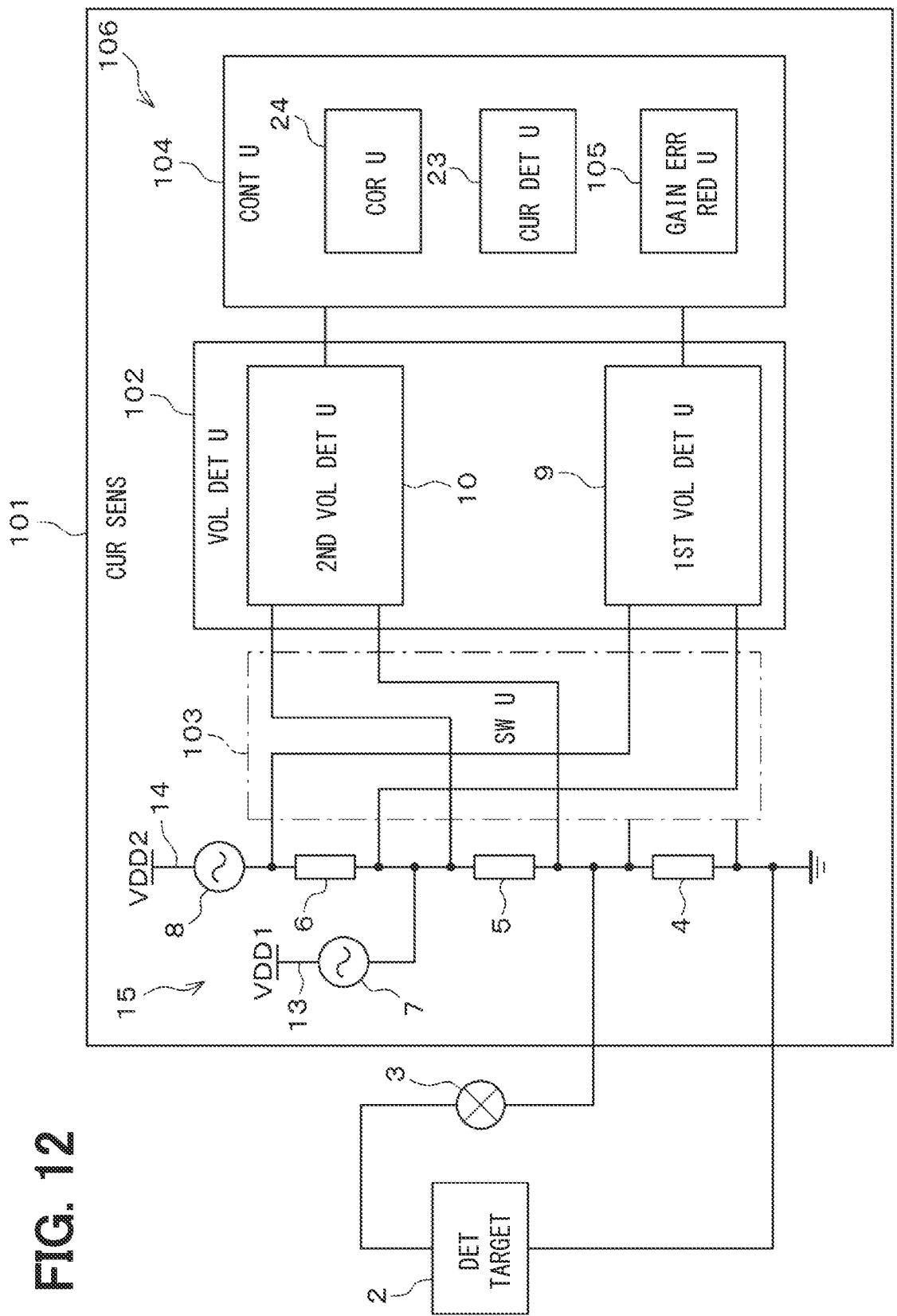
FIG. 12 is a diagram schematically showing a configuration of a current sensor switched to a second connection state according to the fourth embodiment.

The following describes a fourth embodiment with reference to FIGS. 10 to 12.

As shown in FIG. 10, the current sensor 101 of the present embodiment is different from the current sensor 1 of the first embodiment shown in FIG. 1 in that the current sensor 101 includes a voltage detection unit 102 instead of the voltage detection unit 22, the switching unit 103 is added, and the current sensor 101 includes the control unit 104 in place of the control unit 12, and the like.

The voltage detection unit 102 is different from the voltage detection unit 22 in that the third voltage detection unit 11 is omitted. Similar to the switching unit 92 of the fourth embodiment, the switching unit 103 is configured by, for example, a multiplexer or the like, and switches the connection state between the terminals of the shunt resistors 4, the correction resistors 5, and 6 and the input terminals of the voltage detection unit 102. The operation of the switching unit 103 is controlled by the control unit 104.

In the connection state of the switching unit 103, each of the first voltage detection unit 9, and the second voltage detection unit 10 are switchable in order to detect each of the terminal voltages of the shunt resistor 4, the correction resistor 5, and the correction resistor 6. The connection state of the switching unit 103 is, for example, switchable to be the first connection state as shown in FIG. 11 such that the first voltage detection unit 9 detects the terminal voltage of the shunt resistor 4, and the second voltage detection unit 10 detects the correction resistor 5. Further, the connection state of the switching unit 103 is, for example, switchable to be the second connection state as shown in FIG. 12 such that the first voltage detection unit 9 detects the terminal voltage of the correction resistor 5, and the second voltage detection unit 10 detects the correction resistor 6.

Further, the connection state of the switching unit 103 may be switched so that, for example, the first voltage detection unit 9 detects the terminal voltage of the correction resistor 5 and the second voltage detection unit 10 detects the terminal voltage of the shunt resistor 4. Further, the connection state of the switching unit 103 may be switched so that, for example, the first voltage detection unit 9 detects the terminal voltage of the correction resistor 6 and the second voltage detection unit 10 detects the terminal voltage of the correction resistor 5.

Further, the connection state of the switching unit 103 may be switched so that both the first voltage detection unit 9 and the second voltage detection unit 1 detect the terminal voltage of the shunt resistor 4, for example. Further, the connection state of the switching unit 103 may be switched so that, for example, both the first voltage detection unit 9 and the second voltage detection unit 10 detect the terminal voltage of the correction resistor 5. Further, the connection state of the switching unit 103 may be switched so that, for example, both the first voltage detection unit 9 and the second voltage detection unit 10 detect the terminal voltage of the correction resistor 6.

The control unit 104 is different from the control unit 12 in that a functional block of a gain error reduction unit 105 is added. In the above configuration, the resistance value correction circuit 106 that corrects the resistance value for detection is configured by the correction resistors 5 and 6, the signal application unit 15, the voltage detection unit 102, the correction unit 24, the switching unit 103, and the gain error reduction unit 105. Similar to the gain error reduction unit 94 of the fourth embodiment, the gain error reduction unit 105 includes the first A/D converter 16 of the first voltage detection unit 9 and the second A/D converter 18 of the second voltage detection unit 10 so that the gain error of each ADC is reduced.

Then, the gain error reduction unit 105 can reduce the gain error of each ADC by switching the connection state of the switching unit 103 as follows. That is, in the gain error reduction unit 105, for example, the switching state of the switching unit 103 is switched such that both the first voltage detection unit 9 and the second voltage detection unit 10 detect the terminal voltage of the shunt resistor 4, the correction resistor 5, or the correction resistor 6. As a result, the gain error reduction unit 105 can reduce the relative gain error of each ADC based on the detected values of the terminal voltages of the shunt resistor 4, the correction resistor 5 or the correction resistor 6 detected by each of the first voltage detection unit 9 and the second voltage detection unit 10. In this case, the gain error reduction unit 105 can make corrections so that the gains of the ADCs are the same, for example.

Further, the gain error reduction unit 105 switches the connection state of the switching unit 103 to be the first connection state shown in FIG. 11 during the first period at the time of correction. Then, the gain error reducing unit 105 switches the connection state of the switching unit 103 to be the second connection state shown in FIG. 12 during the second period at the time of correction. In the first connection state, the first voltage detection unit 9 can detect the terminal voltage of the shunt resistor 4, and the second voltage detection unit 10 can detect the terminal voltage of the correction resistor 5. In the second connection state, the first voltage detection unit 9 can detect the terminal voltage of the correction resistor 6, and the second voltage detection unit 10 can detect the terminal voltage of the correction resistor 5.

In this case, the gain errors of the first A/D converter 16 and the second A/D converter 18 are reduced as follows. That is, assuming that the gain error of the first A/D converter 16 is defined as G1 and the gain error of the second A/D converter 18 is defined as G2, the value representing the ratio of the resistance values of the shunt resistor 4 and the correction resistor 5 obtained by the correction unit 24 in the first period is defined as "(G1×R)/(G2×R1)". Further, the value representing the ratio of each resistance value of the correction resistor 5 and the correction resistor 6 obtained by the correction unit 24 in the second period is defined as "(G2×R1)/(G1×R2)". The value representing the ratio of the resistance values of the shunt resistor 4 and the correction resistor 6 obtained by multiplying these values is defined as "R/R2", and the gain errors G1 and G2 of the ADCs are canceled out. As described above, in the above configuration, the gain error reduction unit 105 can cancel by averaging the gain errors of each ADC.

As described above, the resistance value correction circuit 106 of the current sensor 101 of the present embodiment includes a gain error reduction unit 105 for reducing each gain error of the first A/D converter 16 of the first voltage detection unit 9, and the second A/D converter 18 of the second voltage detection unit 10. According to such a configuration, the gain errors of the first A/D converter 16, and the second A/D converter 18 can be reduced to a very small value such as 0.1%. Therefore, according to the present embodiment, the detection accuracy of the terminal voltages of the shunt resistor 4 and the correction resistors 5 and 6 by the voltage detection unit 102 is further improved, and as a result, the correction accuracy of the resistance value for detection is further improved.

In this case, the voltage detection unit 102 has a configuration in which the third voltage detection unit 11 is omitted from the voltage detection unit 22 in each of the above embodiments. Here, in this case, the current sensor 101 includes a switching unit 103 for switching the connection state between each terminal of the shunt resistor 4, the correction resistors 5, and 6 and each input terminal of the voltage detection unit 102, and by switching the connection state of the switching unit 103, the terminal voltages of the shunt resistor 4 and the correction resistor 5 in the first period are detected, and the terminal voltages of the correction resistor 5 and the correction resistor 6 in the second period are detected by the two voltage detection units, that are the first voltage detection unit 9 and the second voltage detection unit 10. Therefore, according to the present embodiment, the same operation as that of each of the above-described embodiments can be performed while maintaining the circuit scale to be small by the amount that the third voltage detection unit 11 is omitted.

Fifth Embodiment

A fifth embodiment will be described below with reference to FIG. 13.

Figure 13:
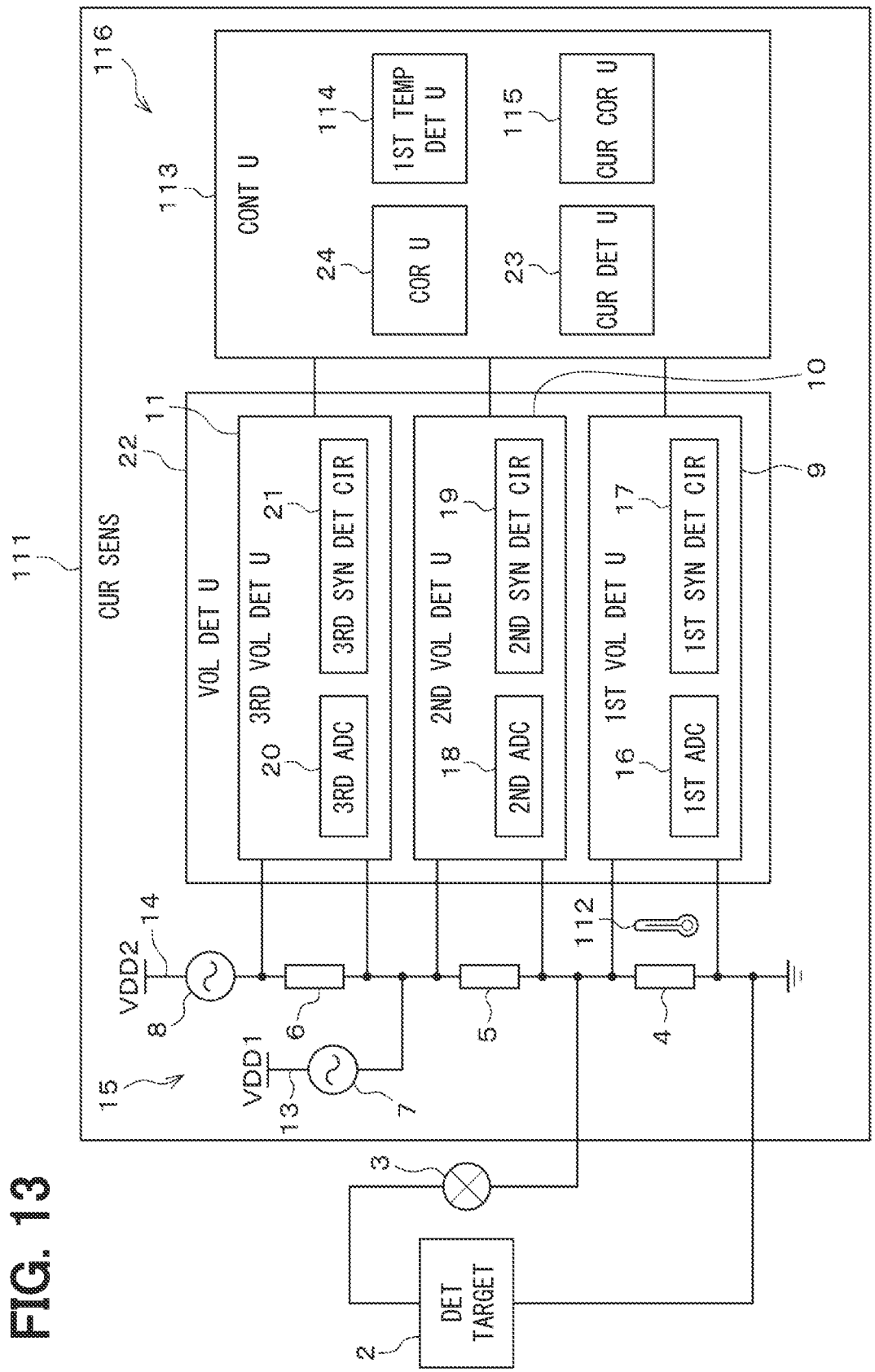
FIG. 13 is a diagram schematically showing a configuration of a current sensor according to a fifth embodiment.

As shown in FIG. 13, the current sensor 111 of the present embodiment is different from the current sensor 1 of the first embodiment shown in FIG. 1 in that a temperature sensor 112 is added, and the current sensor 111 has a control unit 113 instead of the control unit 12. The temperature sensor 112 is provided in the vicinity of the shunt resistor 4, and outputs a temperature detection signal according to the temperature of the shunt resistor 4.

The control unit 113 is different from the control unit 12 in that functional blocks such as a first temperature detection unit 114 and a current value correction unit 115 are added. In the above configuration, the resistance value correction circuit 116 that corrects the resistance value for detection by the correction resistors 5 and 6, the signal application unit 15, the voltage detection unit 22, the correction unit 24, the first temperature detection unit 114, and the current value correction unit 115. The first temperature detection unit 114 detects the temperature of the shunt resistor 4 based on the temperature detection signal output from the temperature sensor 112.

The current value correction unit 115 cooperates with the correction unit 24 to perform the following operations. That is, the current value correction unit 115 corrects the resistance value for detection based on the calculated resistance value and the temperature detection value by the first temperature detection unit 114. Specifically, the current value correction unit 115 corrects the resistance value for detection based on the calculated resistance value after grasping the temperature of the shunt resistor 4 based on the temperature detection value by the first temperature detection unit 114, and finally, corrects the detection value of the detection target current. As described above, the current value correction unit 115 corrects the detected value of the detection target current based on the temperature detected value by the first temperature detection unit 114.

As described above, the resistance value correction circuit 116 of the current sensor 111 of the present embodiment includes the current value correction unit 115 that corrects the resistance value for detection and, finally, corrects the detection value of the detection target current based on the temperature detection value of the first temperature detection unit 114 together with the first temperature detection unit 114 that detects the temperature of the shunt resistor 4. According to such a configuration, it is possible to correct the resistance value for detection with high accuracy, and corrects the detection target current with high accuracy, taking into consideration the temperature characteristic of the resistance value of the shunt resistor 4.

Sixth Embodiment

A sixth embodiment will be described below with reference to FIG. 14.

Figure 14:
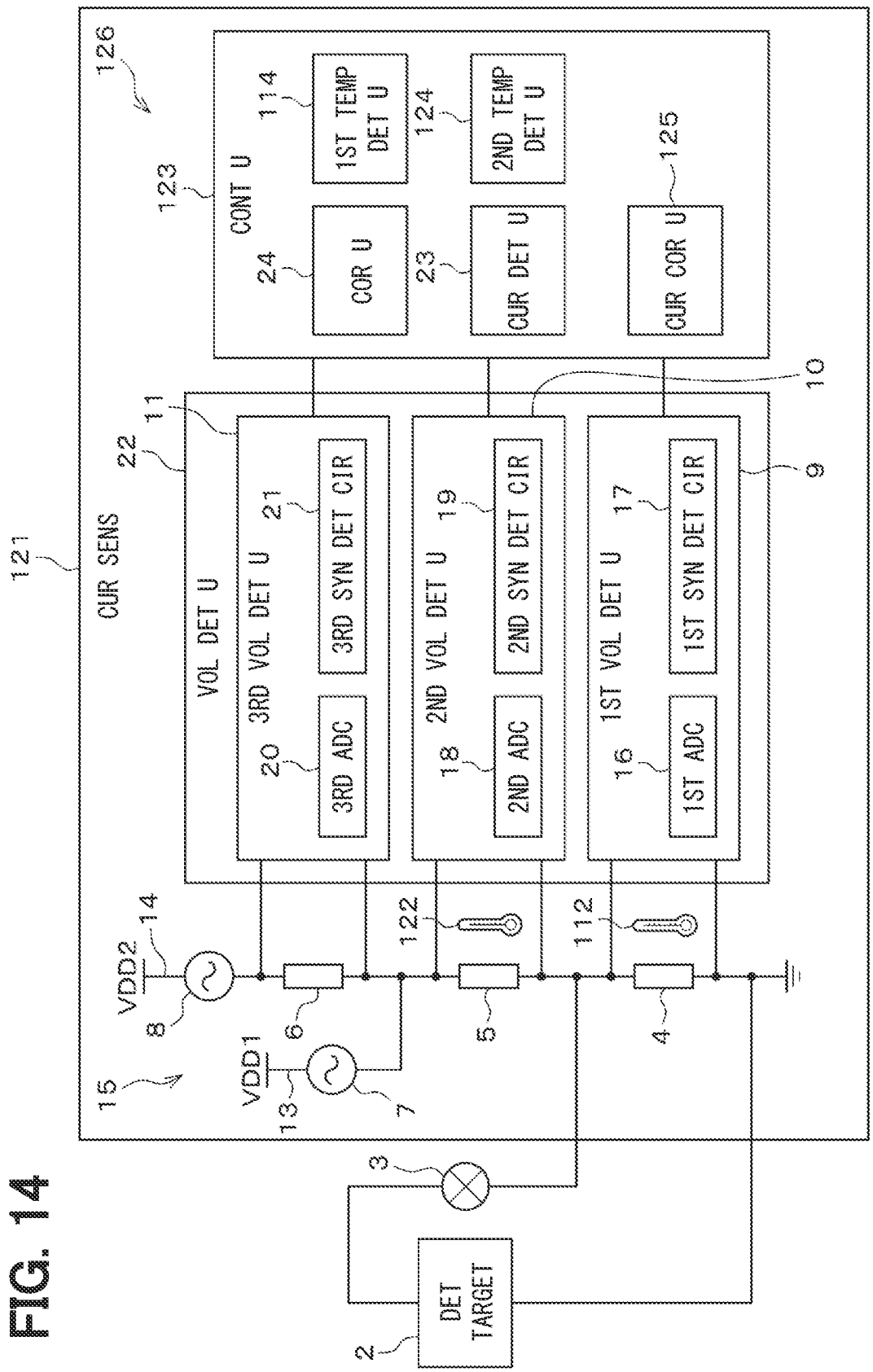
FIG. 14 is a diagram schematically showing a configuration of a current sensor according to a sixth embodiment.

As shown in FIG. 14, the current sensor 121 of the present embodiment is different from the current sensor 111 of the fifth embodiment shown in FIG. 13 in that a temperature sensor 122 is added, and the current sensor 121 has a control unit 123 instead of the control unit 113. The temperature sensor 122 is provided in the vicinity of the correction resistor 5, and outputs a temperature detection signal corresponding to the temperature of the correction resistor 5.

The control unit 123 differs from the control unit 113 in that a functional block of a second temperature detection unit 124 is added, and a current value correction unit 125 is provided in place of the current value correction unit 115. In the above configuration, the resistance value correction circuit 126 that corrects the resistance value for detection by the correction resistors 5 and 6, the signal application unit 15, the voltage detection unit 22, the correction unit 24, the first temperature detection unit 114, the second temperature detection unit 124 and the current value correction unit 125. The second temperature detection unit 124 detects the temperature of the correction resistor 5 based on the temperature detection signal output from the temperature sensor 122.

In addition to the same operation as the current value correction unit 115, the current value correction unit 125 performs the following operations in cooperation with the correction unit 24. That is, the current value correction unit 125 corrects the correction resistance value based on the temperature detection value by the second temperature detection unit 124, and calculates the calculation resistance value using the corrected correction resistance value. In other words, the current value correction unit 125 corrects the calculation resistance value based on the temperature detection value by the second temperature detection unit 124.

Then, the current value correction unit 125 corrects the resistance value for detection based on the calculation resistance value after the correction and the temperature detection value by the first temperature detection unit 114, and eventually corrects the detection value of the detection target current. In this way, the current value correction unit 125 corrects the detected value of the detection target current based on the temperature detection value by the first temperature detection unit 114 and the temperature detection value by the second temperature detection unit 124.

As described above, the resistance value correction circuit 126 of the current sensor 121 of the present embodiment has a first temperature detection unit 114 that detects the temperature of the shunt resistor 4, and a second temperature detection unit 124 that detects the temperature of the correction resistor 5, and a current value correction unit 125. The current value correction unit 125 corrects the resistance value for detection, and eventually corrects the detection value of the detection target current, based on the temperature detection value by the first temperature detection unit 114 and the temperature detection value by the second temperature detection unit 124. According to such a configuration, not only the temperature characteristic of the resistance value of the shunt resistor 4 but also the temperature characteristic of the resistance value of the correction resistor 5 is taken into consideration, and the resistance value for detection is corrected with high accuracy, and eventually the detection target current is detected with high accuracy.

Seventh Embodiment

A seventh embodiment will be described below with reference to FIG. 15.

Figure 15:
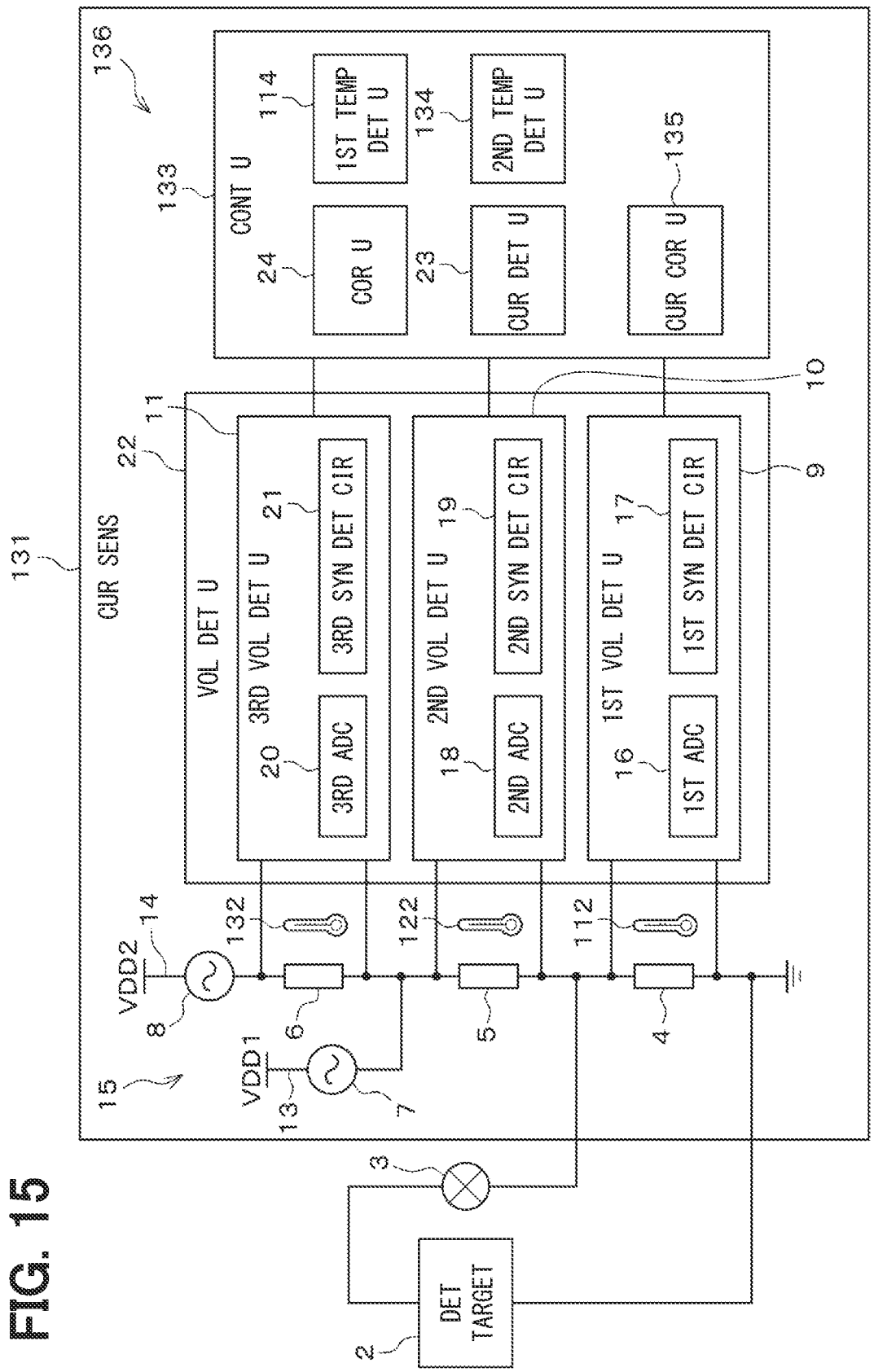
FIG. 15 is a diagram schematically showing a configuration of a current sensor according to a seventh embodiment.

As shown in FIG. 15, the current sensor 131 of the present embodiment is different from the current sensor 121 of the sixth embodiment shown in FIG. 14 in that a temperature sensor 132 is added, and the current sensor 121 has a control unit 133 instead of the control unit 123. The temperature sensor 132 is provided in the vicinity of the correction resistor 6, and outputs a temperature detection signal corresponding to the temperature of the correction resistor 6.

The control unit 133 is different from the control unit 123 in that a second temperature detection unit 134 instead of the second temperature detection unit 124 is arranged and a current value correction unit 135 instead of the current value correction unit 125 is arranged. In the above configuration, the resistance value correction circuit 136 that corrects the resistance value for detection by the correction resistors 5 and 6, the signal application unit 15, the voltage detection unit 22, the correction unit 24, the first temperature detection unit 114, the second temperature detection unit 134 and the current value correction unit 135. The second temperature detection unit 134 has a function of detecting the temperature of the correction resistor 6 based on the temperature detection signal output from the temperature sensor 132, in addition to the same function as that of the second temperature detection unit 124.

The current value correction unit 135 cooperates with the correction unit 24 to perform the following operations. That is, the current value correction unit 135 corrects each correction resistance value based on each temperature detection value by the second temperature detection unit 134, and calculates the calculation resistance value using each corrected correction resistance value. In other words, the current value correction unit 135 corrects the calculation resistance value based on each temperature detection value by the second temperature detection unit 134.

Then, the current value correction unit 135 corrects the resistance value for detection based on the calculation resistance value after the correction and the temperature detection value by the first temperature detection unit 114, and eventually corrects the detection value of the detection target current. In this way, the current value correction unit 135 corrects the detected value of the detection target current based on the temperature detection value by the first temperature detection unit 114 and each temperature detection value by the second temperature detection unit 134.

As described above, the resistance value correction circuit 136 of the current sensor 131 of the present embodiment has a first temperature detection unit 114 that detects the temperature of the shunt resistor 4, and a second temperature detection unit 134 that detects the temperature of the correction resistors 5 and 6, and a current value correction unit 135. The current value correction unit 135 corrects the resistance value for detection, and eventually corrects the detection value of the detection target current, based on the temperature detection value by the first temperature detection unit 114 and each temperature detection value by the second temperature detection unit 134. According to such a configuration, not only the temperature characteristic of the resistance value of the shunt resistor 4 but also the temperature characteristic of each resistance value of the correction resistors 5 and 6 is taken into consideration, and the resistance value for detection is corrected with high accuracy, and eventually the detection target current is detected with high accuracy.

Eighth Embodiment

Figure 16:
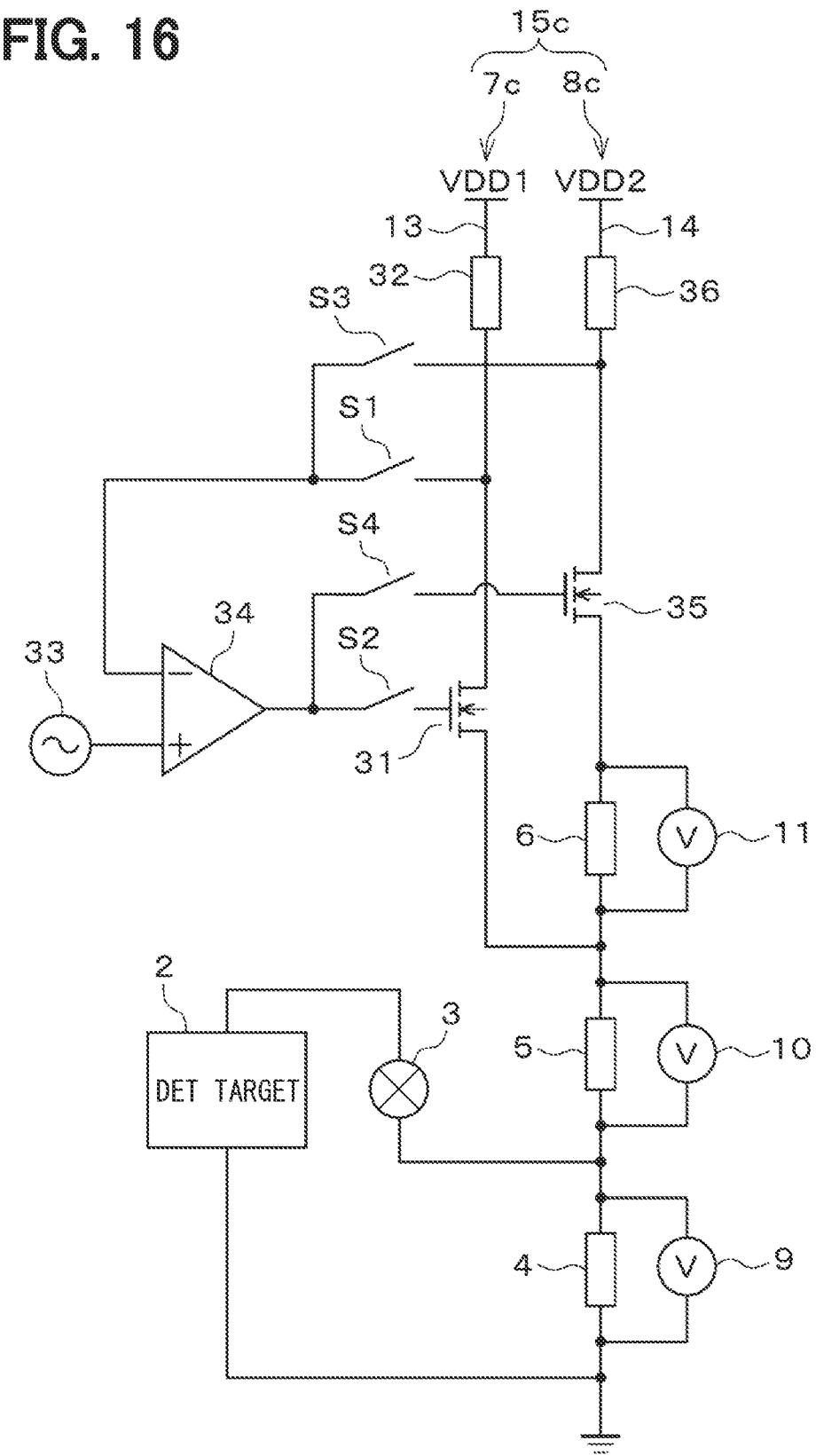
FIG. 16 is a diagram showing a specific first configuration example of the signal application unit according to the eighth embodiment.
Figure 17:
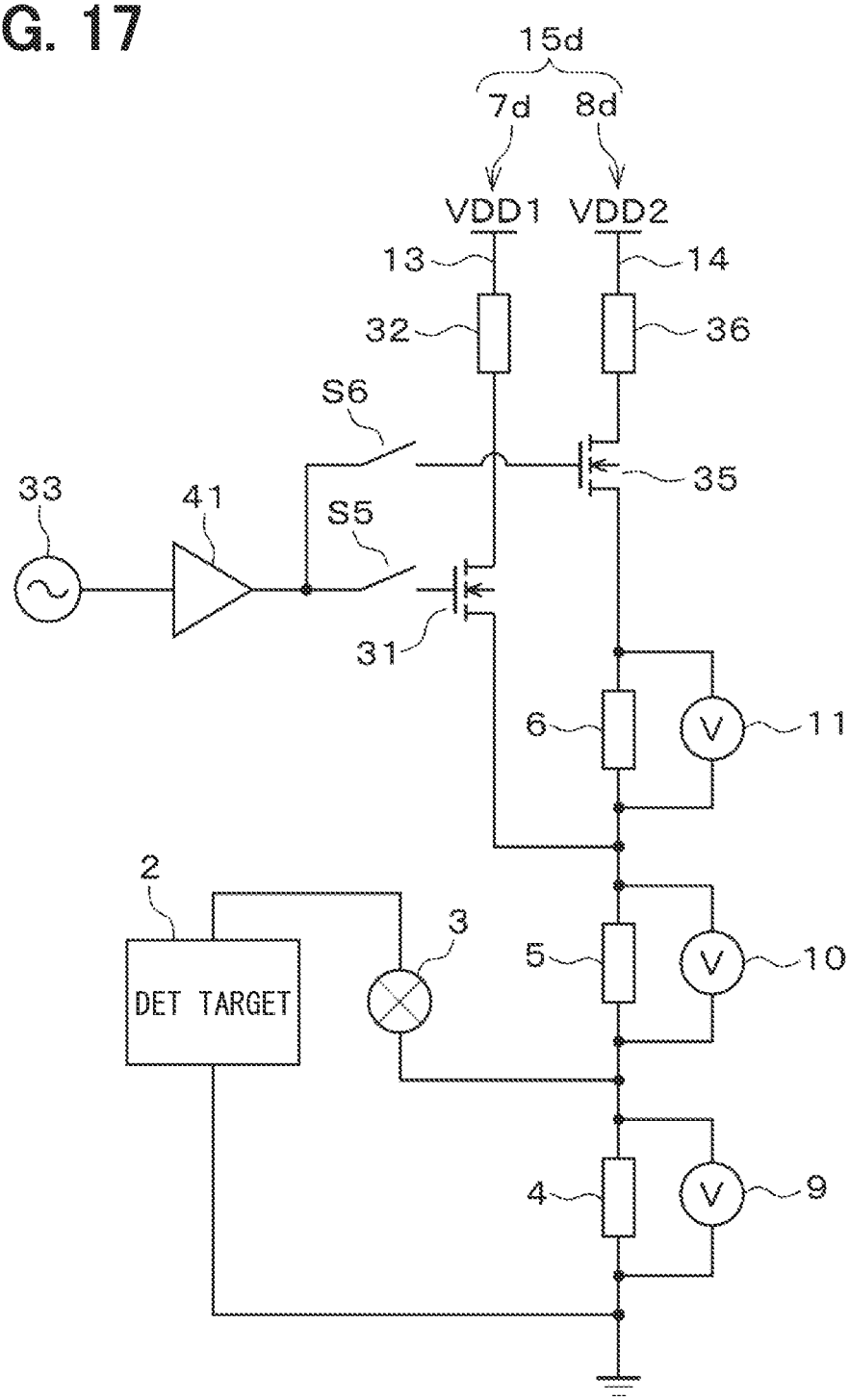
FIG. 17 is a diagram showing a specific second configuration example of the signal application unit according to the eighth embodiment.

The following will describe an eighth embodiment of the present disclosure with reference to FIG. 16 and FIG. 17.

In the specific configuration example of the signal application units 15 and 74 described in each of the above embodiments, the first signal application units 7 and 72 and the second signal application units 8 and 73 each have a dedicated amplifier or buffer. Alternatively, they may share the same amplifier or buffer.

For example, as shown in FIG. 16, the first signal application unit 7 and the second signal application unit 8 may share the same amplifier. That is, the first signal application unit 7c in the signal application unit 15c shown in FIG. 16 is different from the first signal application unit 7a shown in FIG. 2 in that switches S1 and S2 are added. In this case, the inverting input terminal of the OP amplifier 34 is connected to the drain of the transistor 31 via the switch S1, and its output terminal is connected to the gate of the transistor 31 via the switch S2.

The second signal application unit 8c of the signal application unit 15c is different from the second signal application unit 8a shown in FIG. 2 in that the signal generation unit 37 and the OP amplifier 38 are omitted, and switches S3 and S4 are added. In this case, the signal generation unit 33 and the OP amplifier 34 are used not only in the first signal application unit 7c but also in the second signal application unit 8c. Therefore, the inverting input terminal of the OP amplifier 34 is connected to the drain of the transistor 35 via the switch S3, and the output terminal thereof is connected to the gate of the transistor 35 via the switch S4.

In the above configuration, the switches S1 and S2 and the switches S3 and S4 are turned on and off in a complementary manner. Specifically, the switches S1 and S2 are turned on during the first period of correction, and the switches S3 and S4 are turned on during the second period of correction. As a result, the first signal application unit 7c can operate using the OP amplifier 34 in the first period, and the second signal application unit 8c can operate using the OP amplifier 34 in the second period.

For example, as shown in FIG. 17, the first signal application unit 7 and the second signal application unit 8 may share the same buffer. That is, the first signal application unit 7d in the signal application unit 15d shown in FIG. 17 is different from the first signal application unit 7b shown in FIG. 3 in that switch S5 is added. In this case, the output terminal of the buffer is connected to the gate of the transistor 31 via the switch S5.

The second signal application unit 8d in the signal application unit 15d is different from the second signal application unit 8b shown in FIG. 3 in that the signal generation unit 37 and the buffer 42 are omitted, and the switch S6 is added, and the like. In this case, the signal generation unit 33 and the buffer 41 are used not only in the first signal application unit 7d but also in the second signal application unit 8d. Therefore, the output terminal of the buffer 41 is connected to the gate of the transistor 35 via the switch S6.

In the above configuration, the switch S5 and the switch S6 are turned on and off in a complementary manner. Specifically, the switch S5 is turned on during the first period of correction, and the switch S6 is turned on during the second period of correction. As a result, the first signal application unit 7d can operate using the buffer 41 in the first period, and the second signal application unit 8d can operate using the buffer 41 in the second period.

As described above, the first signal application units 7c and 7d and the second signal application units 8c and 8d of the present embodiment are configured to share the same amplifier or buffer. According to such a configuration, the circuit scale is reduced by the amount that one amplifier or buffer is omitted as compared with the configuration in which the first signal application unit 7 and the second signal application unit 8 are provided with dedicated amplifiers or buffers different from each other.

Other Embodiments

The present disclosure is not limited to the embodiments that have been described above and illustrated in the drawings, but can freely be modified, combined, or expanded without departing from the gist of the present disclosure.

The numerical values and the like shown in the embodiments described above are examples, and are not limited to those examples.

The resistance value correction circuit 25 or the like has a configuration having two correction resistors 5 and 6, alternatively, the number of correction resistors may be a plurality, and even three or more correction resistors may be provided.

The specific configuration of the signal application units 15 and 74 may not be limited to the configuration described in each of the above embodiments, and may be any configuration as long as the feature applies an AC signal to all or a part of the series circuit of the shunt resistor 4 and the plurality of correction resistors 5 and 6.

The specific configuration of the first synchronous detection circuit 17 may not be limited to the configuration described in each of the above embodiments, and may be any configuration as long as the feature inputs the signal of the terminal of the shunt resistor 4 and performs synchronous detection at the same frequency as the AC signal to extract and output a signal. The specific configuration of the second synchronous detection circuit 19 may be such that the signal of the terminal of the correction resistor 5 can be input and synchronous detection can be performed at the same frequency as the frequency of the AC signal to extract and output the signal. The specific configuration of the third synchronous detection circuit 21 may be such that the signal of the terminal of the correction resistor 6 can be input and synchronous detection can be performed at the same frequency as the frequency of the AC signal to extract and output the signal.

Although the present disclosure has been described in accordance with embodiments, it is understood that the present disclosure is not limited to such embodiments or structures. The present disclosure incorporates various modifications and variations within the scope of equivalents. In addition, various combinations and forms, and further, other combinations and forms including only one element, or more or less than these elements are also within the sprit and the scope of the present disclosure.

1, 71, 91, 101, 111, 121, and 131 represent a current sensor, 4 represents a shunt resistor, 5, and 6 represent a correction resistor, 7, 7a, 7b, 7c, 7d, 72, 72a, and 72b represent a first signal application unit, 8, 8a, 8b, 8c, 8d, 73, 73a, and 73b represent a second signal application unit, 9 represents a first voltage detection unit, 10 represents a second voltage detection unit, 11 represents a third voltage detection unit, 15, 15a, 15b, 15c, 15d, 74, 74a, and 74b represent a signal application unit, 16 represents a first A/D converter, 17 represents a first synchronous detector circuit, 18 represents a second A/D converter, 19 represents a second synchronous detector circuit, 20 represents a third A/D converter, 21 represents a third synchronous detection circuit, 22, and 102 represent a voltage detection unit, 24 represents a correction unit, 25, 75, 95, 106, 116, 126, and 136 represent a resistance value correction circuit, 92, and 103 represent a switching unit, 94, and 105 represents a gain error reducing unit, 114 represents a first temperature detection unit, 115, 125, and 135 represent a current value correction unit, and 124, and 134 represent a second temperature detection unit.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A current sensor for detecting a detection target current based on a terminal voltage of a shunt resistor arranged in series in a path through which the detection target current flows and a resistance value for current detection corresponding to a resistance value of the shunt resistor, the current sensor comprising:
    a resistance value correction circuit for correcting the resistance value for current detection, wherein:
    the resistance value correction circuit includes:
        a plurality of correction resistors, all of which are connected in series together with the shunt resistor in an other path different from the path through which the detection target current flows, and have a resistance accuracy higher than the shunt resistor;
        a signal application unit that applies an alternating current signal to all or a part of a series circuit of the shunt resistor and the plurality of correction resistors;
        a voltage detection unit that detects a terminal voltage of the shunt resistor and a terminal voltage of a part of the correction resistors in a first period when the alternating current signal is applied to the part of the series circuit including the shunt resistor, and detects terminal voltages of all of the correction resistors in a second period when the alternating current signal is applied to all of the series circuit; and
        a correction unit that calculates the resistance value of the shunt resistor based on a detection value of each terminal voltage detected by the voltage detection unit in the first period and a detection value of each terminal voltage detected by the voltage detection unit in the second period, and corrects the resistance value for current detection based on a calculation resistance value, which is a calculated resistance value of the shunt resistor; and
    resistance values and resistance accuracies of the plurality of correction resistors are higher as the plurality of correction resistors are disposed farther from the shunt resistor in the series circuit.

2. The current sensor according to claim 1, wherein:
    the voltage detection unit includes a plurality of A/D converters that perform an A/D conversion operation for detecting the terminal voltage of the shunt resistor and the terminal voltages of the correction resistors; and
    the resistance value correction circuit further includes:
        a switching unit that switches a connection state to connect each of the plurality of A/D converters with each of the shunt resistor and the plurality of correction resistors, respectively; and
        a gain error reduction unit that reduces a gain error of the plurality of A/D converters by switching the connection state of the switching unit.

3. The current sensor according to claim 1, wherein:
    the resistance value correction circuit further includes:
        a first temperature detection unit that detects a temperature of the shunt resistor; and
        a current value correction unit that corrects a detection value of the detection target current based on a temperature detection value by the first temperature detection unit.

4. The current sensor according to claim 3, wherein:
    the resistance value correction circuit further includes a second temperature detection unit that detects a temperature of at least one of the correction resistors; and
    the current value correction unit corrects the detection value of the detection target current based on the temperature detection value of the first temperature detection unit and a temperature detection value of the second temperature detection unit.

5. The current sensor according to claim 1, wherein:
    the signal application unit includes:

a first signal application unit that applies the alternating current signal to the part of the series circuit including the shunt resistor; and a second signal application unit that applies the alternating current signal to all of the series circuit; and the first signal application unit and the second signal application unit share a same amplifier or a same buffer.

6. The current sensor according to claim 1, wherein:

the signal application unit applies the alternating current signal having a pulse wave or a sine wave to the series circuit.

7. The current sensor according to claim 1, wherein:

the voltage detection unit is configured to:

input a signal of a terminal of the shunt resistor;

perform synchronous detection at a same frequency as a frequency of the alternating current signal to extract the signal;

detect the terminal voltage of the shunt resistor based on an extracted signal;

input a signal of a terminal of each correction resistor;

perform synchronous detection at the same frequency as the frequency of the alternating current signal to extract and output the signal; and detect the terminal voltage of each correction resistor based on an extracted signal.

* * * * *

UNITED STATES PATENT AND TRADEMARK OFFICE
CERTIFICATE OF CORRECTION

| | |
|---|---|
| PATENT NO. | : 11,846,656 B2 |
| APPLICATION NO. | : 17/834061 |
| DATED | : December 19, 2023 |
| INVENTOR(S) | : Tomohiro Nezuka, Yoshikazu Furuta and Shotaro Wada |

It is certified that error appears in the above-identified patent and that said Letters Patent is hereby corrected as shown below:

On the Title Page

Item (73) (Assignees)
Change the name of the second Assignee from TOYOTA IDOSHA KABUSHIKI KAISHA to TOYOTA JIDOSHA KABUSHIKI KAISHA.

Signed and Sealed this
Eleventh Day of June, 2024

*Katherine Kelly Vidal*

Katherine Kelly Vidal
*Director of the United States Patent and Trademark Office*